United States Patent
Sakai et al.

(10) Patent No.: US 9,807,885 B2
(45) Date of Patent: Oct. 31, 2017

(54) WIRING BOARD WITH BUILT-IN ELECTRONIC COMPONENT AND METHOD FOR MANUFACTURING THE SAME

(71) Applicant: IBIDEN CO., LTD., Ogaki (JP)

(72) Inventors: Kenji Sakai, Ogaki (JP); Tomoyuki Ikeda, Ogaki (JP); Toshiki Furutani, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/138,792

(22) Filed: Apr. 26, 2016

(65) Prior Publication Data

US 2016/0316566 A1 Oct. 27, 2016

(30) Foreign Application Priority Data

Apr. 27, 2015 (JP) ................. 2015-090711

(51) Int. Cl.
| | |
|---|---|
| H05K 1/18 | (2006.01) |
| H05K 3/00 | (2006.01) |
| H05K 1/02 | (2006.01) |
| H05K 3/46 | (2006.01) |
| H05K 3/32 | (2006.01) |

(52) U.S. Cl.
CPC ........... *H05K 1/185* (2013.01); *H05K 1/0298* (2013.01); *H05K 3/32* (2013.01); *H05K 3/4644* (2013.01); *H05K 2201/09009* (2013.01)

(58) Field of Classification Search
CPC .......... H05K 1/185–1/189; H05K 1/18–1/184; H05K 3/32; H05K 3/4644; H05K 2201/09009
See application file for complete search history.

(56) References Cited

U.S. PATENT DOCUMENTS

| | | | | |
|---|---|---|---|---|
| 4,800,459 A | * | 1/1989 | Takagi | H01L 23/49822 257/E23.062 |
| 5,565,706 A | * | 10/1996 | Miura | H01L 23/13 257/691 |
| 6,153,290 A | * | 11/2000 | Sunahara | H01L 21/4857 156/89.16 |

(Continued)

FOREIGN PATENT DOCUMENTS

JP 2014-187125 A 10/2014

*Primary Examiner* — Hoa C Nguyen
(74) *Attorney, Agent, or Firm* — Oblon, McClelland, Maier & Neustadt, L.L.P.

(57) ABSTRACT

A wiring board includes electronic components, a multilayer core substrate including insulating layers and conductive layers such that the insulating layers include a central insulating layer in the center position of the core in the thickness direction, a first build-up layer including an insulating layer and a conductive layer such that the insulating layer has resin composition different from that of the insulating layers in the core, and a second build-up layer including an insulating layer and a conductive layer such that the insulating layer has resin composition different from that of the insulating layers in the core. The core has cavities accommodating the electronic components, respectively, and including a first cavity and a second cavity such that the first and second cavities have different lengths in the thickness direction and are penetrating through the central layer at centers of the first and second cavities in the thickness direction.

20 Claims, 21 Drawing Sheets

(56) References Cited

U.S. PATENT DOCUMENTS

| | | | |
|---|---|---|---|
| 2003/0015342 A1* | 1/2003 | Sakamoto | H01L 21/4846 174/250 |
| 2009/0230541 A1* | 9/2009 | Araki | H01L 24/18 257/693 |
| 2012/0024583 A1* | 2/2012 | Lee | H05K 1/186 174/260 |
| 2012/0212919 A1* | 8/2012 | Mano | H05K 1/185 361/782 |
| 2013/0182401 A1* | 7/2013 | Furutani | H05K 1/0296 361/782 |
| 2013/0220686 A1* | 8/2013 | Sahara | H05K 1/183 174/258 |
| 2014/0133117 A1* | 5/2014 | Saji | H05K 1/0243 361/761 |
| 2014/0144676 A1* | 5/2014 | Chung | H05K 1/186 174/251 |
| 2014/0285213 A1* | 9/2014 | Sakurai | G01R 31/048 324/538 |
| 2014/0360765 A1* | 12/2014 | Kiwanami | H05K 1/185 174/260 |

\* cited by examiner

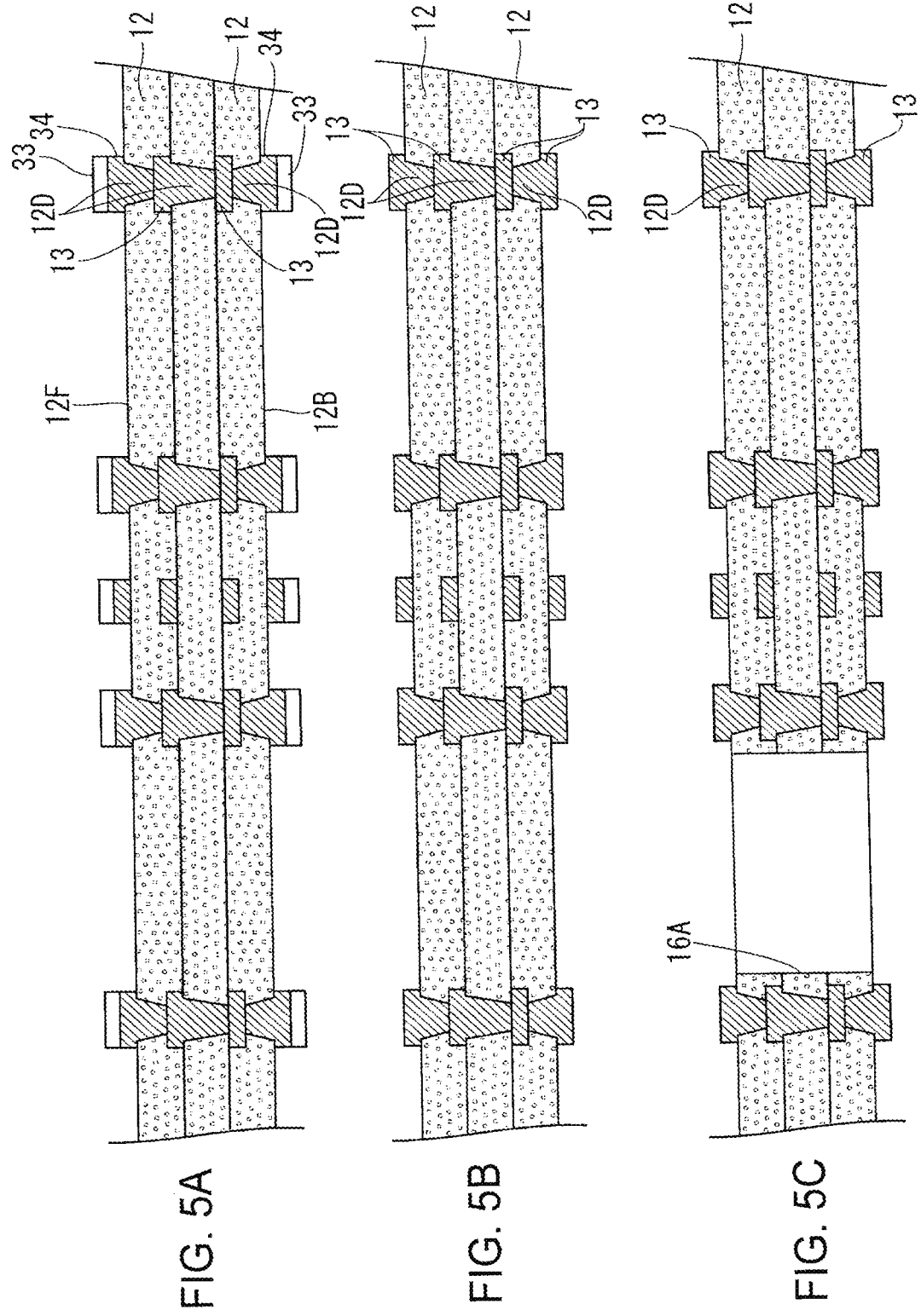

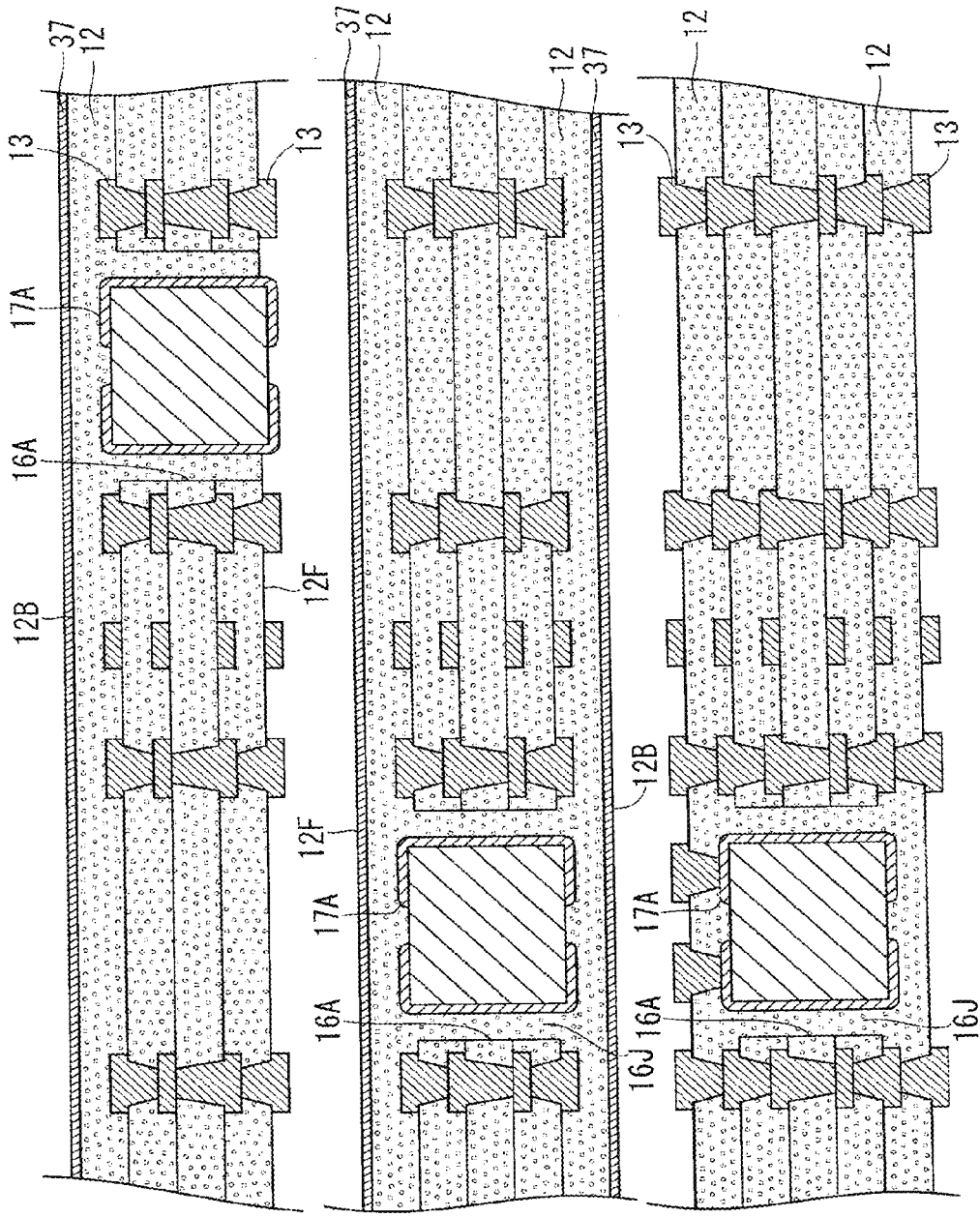

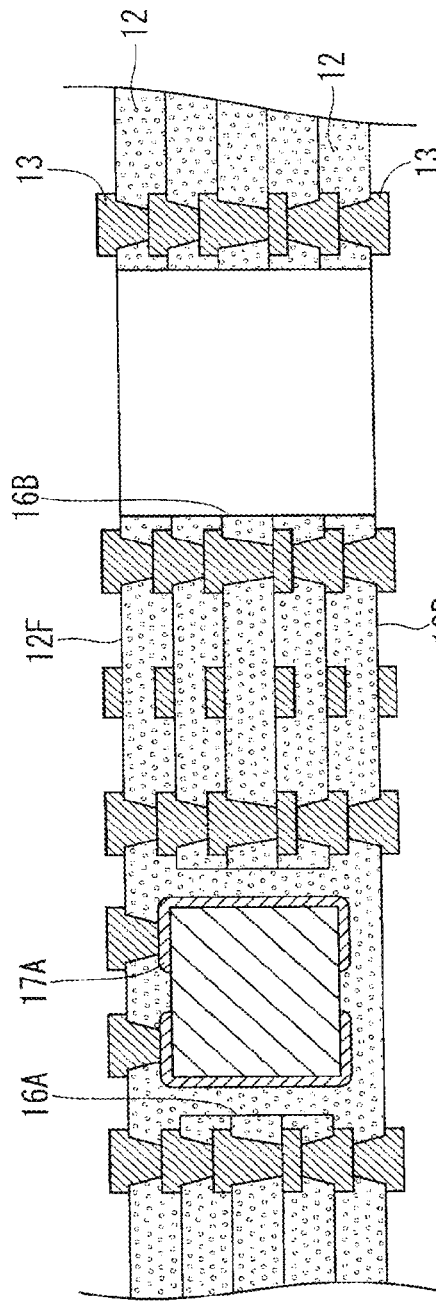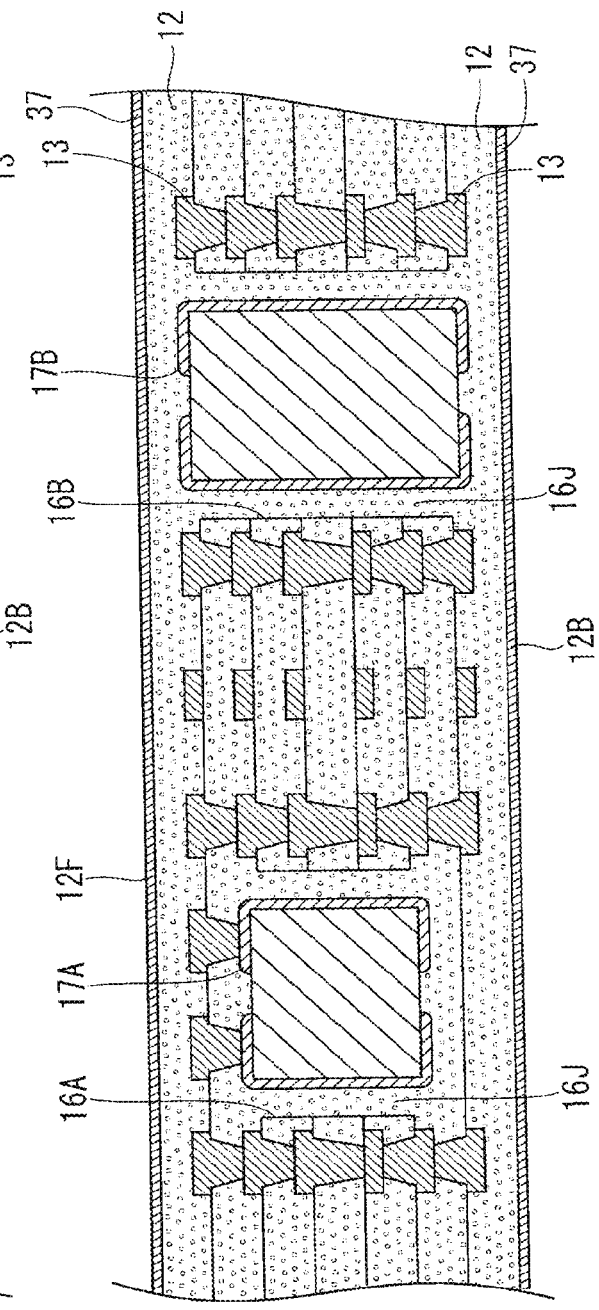

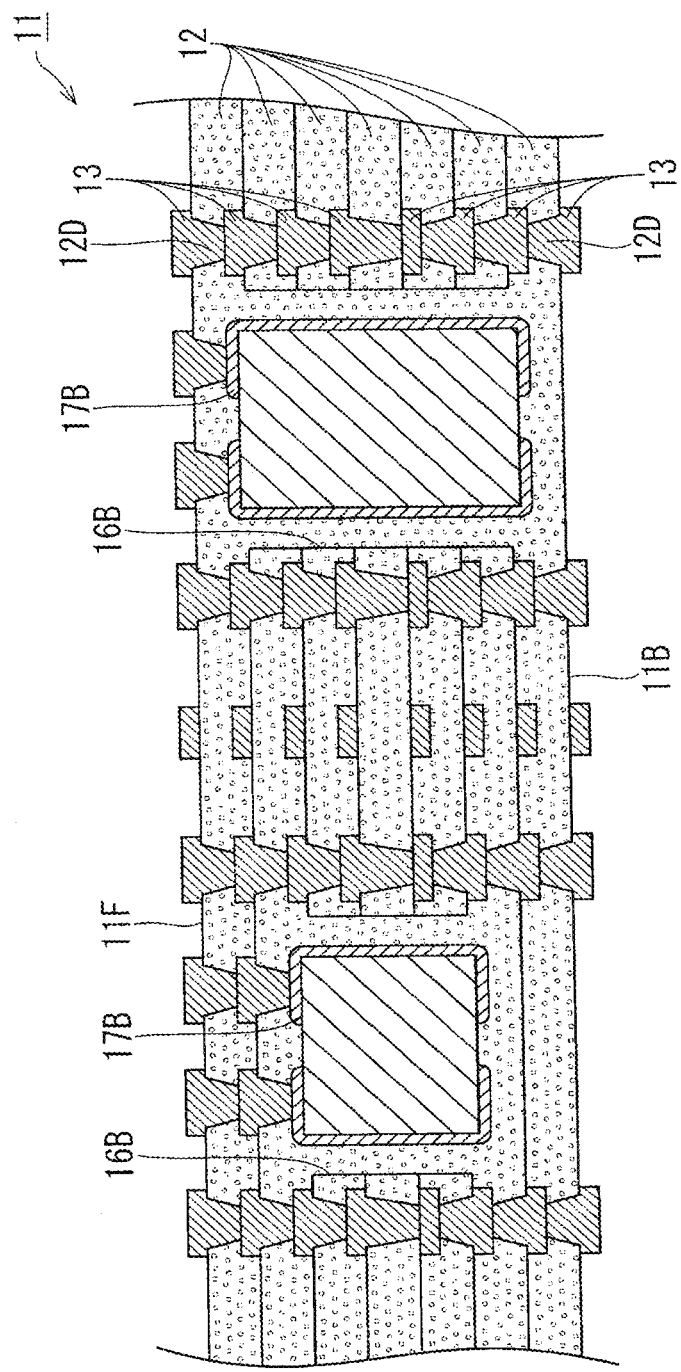

WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2015-090711, filed Apr. 27, 2015, the entire contents of which are incorporated herein by reference.

BACKGROUND OF THE INVENTION

Field of the Invention

The present invention relates to a wiring board with a built-in electronic component, in which multiple cavities for accommodating electronic components are provided in a core substrate, and relates to a method for manufacturing the wiring board.

Description of Background Art

A wiring board with a built-in electronic component may have a structure in which multiple cavities penetrate a core substrate in the same way (for example, see Japanese Patent Laid-Open Publication No. 2014-187125). The entire contents of this publication are incorporated herein by reference.

SUMMARY OF THE INVENTION

According to one aspect of the present invention, a wiring board with a built-in electronic component includes multiple electronic components, a multilayer core substrate including multiple insulating resin layers and multiple conductive layers such that the insulating resin layers include a central insulating resin layer formed in the center position of the multilayer core substrate in the thickness direction of the multilayer core substrate, a first build-up layer formed on a first surface of the multilayer core substrate and including an insulating resin layer and a conductive layer such that the insulating resin layer in the first build-up layer has a resin composition which is different from a resin composition of the insulating resin layers in the multilayer core substrate, and a second build-up layer formed on a second surface of the multilayer core substrate and including an insulating resin layer and a conductive layer such that the insulating resin layer in the second build-up layer has a resin composition which is different from the resin composition of the insulating resin layers in the multilayer core substrate. The multilayer core substrate has multiple cavities accommodating the electronic components, respectively, and including a first cavity and a second cavity such that the first and second cavities have different lengths in the thickness direction of the multilayer core substrate and are penetrating through the central insulating resin layer at centers of the first and second cavities in the thickness direction of the multilayer core substrate.

According to another aspect of the present invention, a method for manufacturing a wiring board with a built-in electronic component includes forming a multilayer core substrate including multiple insulating resin layers and multiple conductive layers such that the multilayer core substrate includes a central insulating resin layer positioned in the center position of the multilayer core substrate in the thickness direction of the multilayer core substrate and has multiple cavities which accommodate multiple electronic components, respectively, positioning the electronic components in the cavities formed in the multilayer core substrate such that the electronic components are accommodated in the cavities, respectively, forming on a first surface of the multilayer core substrate a first build-up layer including an insulating resin layer and a conductive layer such that the insulating resin layer in the first build-up layer has a resin composition which is different from a resin composition of the insulating resin layers in the multilayer core substrate, and forming on a second surface of the multilayer core substrate a second build-up layer including an insulating resin layer and a conductive layer such that the insulating resin layer in the second build-up layer has a resin composition which is different from the resin composition of the insulating resin layers in the multilayer core substrate. The forming of the multilayer core substrate including forming the cavities such that the cavities include a first cavity and a second cavity which have different lengths in the thickness direction of the multilayer core substrate and which are penetrating through the central insulating resin layer at centers of the first and second cavities in the thickness direction of the multilayer core substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A-5C are cross-sectional side views illustrating processes for manufacturing the wiring board with a built-in electronic component;

FIG. 7A-7C are cross-sectional side views illustrating processes for manufacturing the wiring board with a built-in electronic component;

FIG. 8A and 8B are cross-sectional side views illustrating processes for manufacturing the wiring board with a built-in electronic component;

FIG. 9 is a cross-sectional side view illustrating a process for manufacturing the wiring board with a built-in electronic component;

DETAILED DESCRIPTION OF THE EMBODIMENTS

Figure 1:
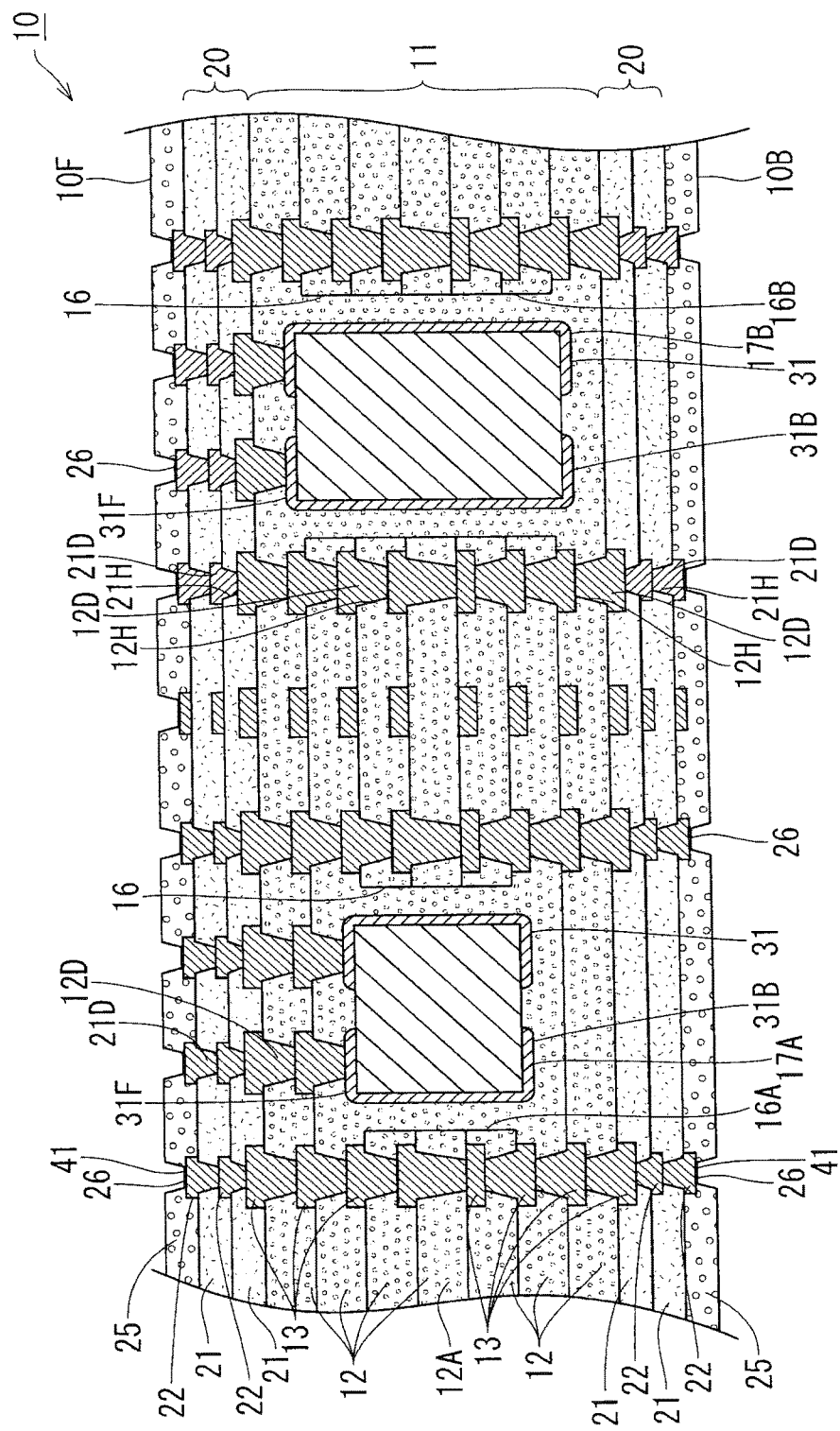
FIG. 1 is a cross-sectional side view of a wiring board with a built-in electronic component according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described based on FIG. 1-18. As illustrated in FIG. 1, in a wiring board 10 with a built-in electronic component of the present embodiment, build-up layers (20, 20) are respectively laminated on front and back sides of a multilayer core substrate 11 into which, as "electronic components" according to an embodiment of the present invention, a multilayer ceramic capacitor (17A) (corresponding to a "capacitor component" according to an embodiment of the present invention) and a multilayer ceramic coil (17B) (correspond to the "coil component" according to an embodiment of the present invention) are built.

The multilayer core substrate 11 is formed by alternately laminating multiple first insulating resin layers 12 and multiple first conductive layers 13. Specifically, on front and back sides of a central insulating resin layer (12A) that is positioned at a center in a plate thickness direction among the multiple first insulating resin layers 12, first conductive layers (13, 13) are respectively formed. On each of the first conductive layers (13, 13), three first insulating resin layers 12 and three first conductive layers 13 are alternately laminated. Further, the first insulating resin layers 12 are each formed a prepreg (a resin sheet of a B stage obtained by impregnating a core material with resin) and each have a thickness of 20-30 μm.

Further, in the multilayer core substrate 11, two cavities (16, 16) that penetrate the multiple first insulating resin layers 12 are formed. The multilayer ceramic capacitor (17A) and the multilayer ceramic coil (17B) are accommodated in the cavities (16, 16) and thereby are built into the multilayer core substrate 11. The multilayer ceramic capacitor (17A) and the multilayer ceramic coil (17B) both have a structure in which two end portions of a ceramic prismatic body are covered by a pair of electrodes (31, 31), and have planar shapes that are respectively slightly smaller than planar shapes of the corresponding cavities (16, 16). Further, the multilayer ceramic capacitor (17A) has a thickness (that is, a distance from a first main surface (31F), which is one of front and back surfaces of an electrode 31 of the multilayer ceramic capacitor (17A), and a second main surface (31B), which is the other one of the front and back surfaces) of about a thickness of three first insulating resin layers 12, whereas the multilayer ceramic coil (17B) has a thickness (that is, a distance between a first main surface (31F), which is one of front and back surfaces of an electrode 31 of the multilayer ceramic coil (17B), and a second main surface (31B), which is the other one of the front and back surfaces) of about a thickness of five first insulating resin layers 12.

Multiple via holes (12H) are formed in each of the first insulating resin layers 12. The via holes (12H) are each formed in a tapered shape that is gradually reduced in diameter toward the central insulating resin layer (12A). The via holes (12H) that are formed in the central insulating resin layer (12A) are each formed in a tapered shape that is gradually reduced in diameter downward. The via holes (12H) are filled with plating and multiple via conductors (12D) (corresponding to "first via conductors" according to an embodiment of the present invention) are formed. Due to the via conductors (12D) in the first insulating resin layer 12, the multilayer ceramic capacitor (17A) or the multilayer ceramic coil (17B) and the first conductive layers 13 are connected to each other, and the first insulating resin layers 12 are connected to each other. The via conductors (12D) that connect to the multilayer ceramic capacitor (17A) and the multilayer ceramic coil (17B) are formed only on the first main surface (31F) side and are not formed on the second main surface (31B) side. Further, the via conductors (12D) that connect to the first main surface (31F) of the multilayer ceramic capacitor (17A) and the multilayer ceramic coil (17B), including also via conductors (21D) of the build-up layer 20 (to be described later), are coaxially connected.

The build-up layer 20 on a side of an F surface (11F), which is a front side surface of the multilayer core substrate 11, and the build-up layer 20 on a side of a B surface (11B), which is a back side surface of the multilayer core substrate 11, are both formed by alternately laminating two second insulating resin layers 21 and two second conductive layers 22 from the multilayer core substrate 11 side. The second insulating resin layers 21, for example, are each an ABF film (manufactured by Ajinomoto Fine Techno Co. Ltd.), and do not each contain a core material. Further, the second insulating resin layers 21 each have a thickness of 7-15 μm, and are thinner than the first insulating resin layers 12 of the multilayer core substrate 11. Further, the second conductive layers 22 are also thinner than the first conductive layers 13 of the multilayer core substrate 11 (that is, both the first insulating resin layers 12 and the first conductive layers 13 of the multilayer core substrate 11 are thicker than the second insulating resin layers 21 and the second conductive layers 22 of the build-up layer 20).

Multiple via holes (21H) are formed also in the second insulating resin layers 21 of the build-up layer 20. The via holes (21H) are filled with plating and multiple via conductors (21D) (corresponding to "second via conductors" according to an embodiment of the present invention) are formed. Due to the via conductors (21D) of the second insulating resin layers 21, the first conductive layers 13 and the second conductive layers 22 are connected to each other, and the second conductive layers 22 are connected to each other. Further, along with that the second insulating resin layers 21 are thinner than the first insulating resin layers 12 of the multilayer core substrate 11, the via conductors (21D) of the second insulating resin layers 21 are shorter than the via conductors (12D) of the first insulating resin layers 12, and the via conductors (21D) of the second insulating resin layers 21 have a via diameter smaller than a via diameter of the via conductors (12D) of the first insulating resin layers 12.

A solder resist layer 25 is laminated on an outermost second conductive layer 22 of each of the build-up layers 20. Multiple pad holes are formed in the solder resist layer 25. Portions of the second conductive layer 22 that are respectively exposed from the pad holes become pads 26.

As described above, the multilayer ceramic capacitor (17A) and the multilayer ceramic coil (17B) are different in thickness. The multilayer ceramic capacitor (17A) is thicker than the multilayer ceramic coil (17B). In the wiring board 10 with a built-in electronic component of the present embodiment, according to the difference between the thicknesses of the multilayer ceramic capacitor (17A) and the multilayer ceramic coil (17B), the two cavities (16, 16) are formed to have different lengths (hereinafter, as appropriate, the cavity 16 that accommodates the multilayer ceramic capacitor (17A) is referred to as a "small cavity (16A)", and the cavity 16 that accommodates the multilayer ceramic coil (17B) is referred to as a "large cavity" (16B); and the small cavity (16A) corresponds to a "first cavity" according to an embodiment of the present invention, and the large cavity (16B) corresponds to a "second cavity" according to an embodiment of the present invention).

The small cavity (16A) is formed to penetrate three first insulating resin layers 12, whereas the large cavity (16B) is formed to penetrate five first insulating resin layers 12. Further, common to both the small cavity (16A) and the large cavity (16B), the central insulating resin layer (12A) is positioned at a center in a thickness direction of the cavities (16A, 16B). That is, thickness direction centers of the small cavity (16A), the large cavity (16B) and the multilayer core substrate 11 are all positioned at the central insulating resin layer (12A). The multilayer ceramic capacitor (17A) and the multilayer ceramic coil (17B) respectively slightly protrude from the cavities (16A, 16B), and the first main surface (31F) and the second main surface (31B) of each of the multilayer ceramic capacitor (17A) and the multilayer ceramic coil (17B) are each flush with an outermost surface of a first conductive layer 13.

Further, an element holding resin (16J) (corresponding to a "filling resin" according to an embodiment of the present invention) is filled in between the multilayer ceramic capacitor (17A) and an inner side surface of the small cavity (16A) and between the multilayer ceramic coil (17B) and an inner side surface of the large cavity (16B). The multilayer ceramic capacitor (17A) and the multilayer ceramic coil (17B) are respectively positioned at positions spaced apart from the entire inner side surfaces of the cavities (16A, 16B). The element holding resin (16J) has the same composition as the first insulating resin layers 12.

Next, a method for manufacturing the wiring board 10 with a built-in electronic component of the present embodiment is described. First, the multilayer core substrate 11 is manufactured as follows.

Figure 2A:
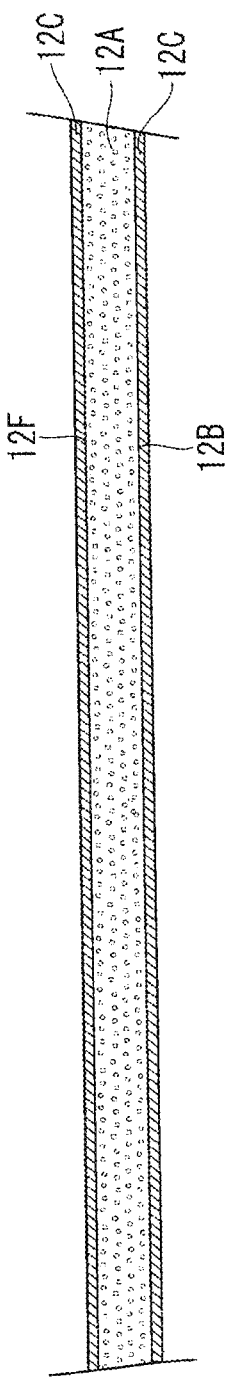
FIG. 2A-2D are cross-sectional side views illustrating processes for manufacturing the wiring board with a built-in electronic component.

(1) As illustrated in FIG. 2A, a substrate is prepared that is formed by laminating a copper foil (12C) on both front and back surfaces of a prepreg as the central insulating resin layer (12A).

Figure 2B:
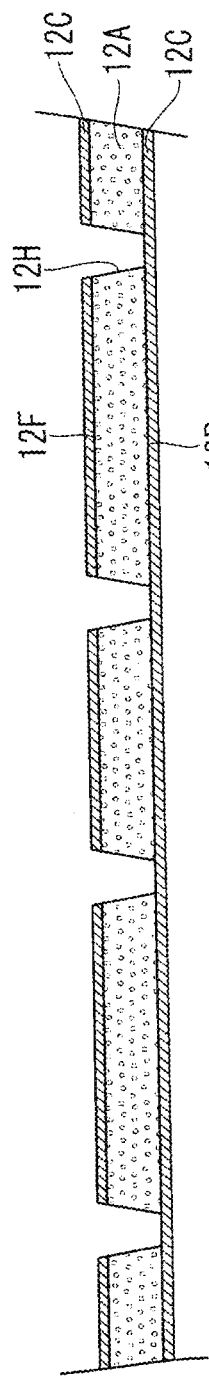

(2) As illustrated in FIG. 2B, the multiple via holes (12H) are formed by irradiating, for example, CO2 laser from the F surface (11F) side of the multilayer core substrate 11.

Figure 2C:
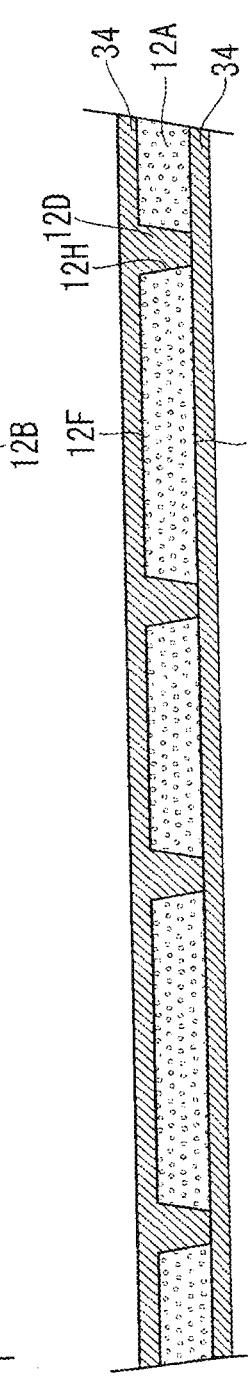

(3) An electrolytic plating treatment. As illustrated in FIG. 2C, the via holes (12H) are filled with electrolytic plating, and the via conductors (12D) are formed, and an electrolytic plating film is formed on the copper foil (11C). Hereinafter, the copper foil (11C) and the electrolytic plating film together are referred to as an electrolytic plating layer 34.

Figure 2D:
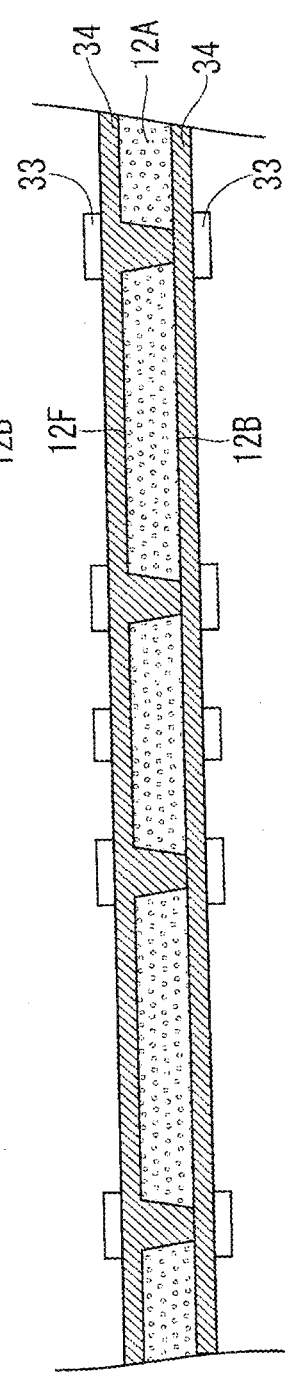

(4) As illustrated in FIG. 2D, an etching resist 33 of a predetermined pattern is formed on the electrolytic plating layer 34.

Figure 3A:
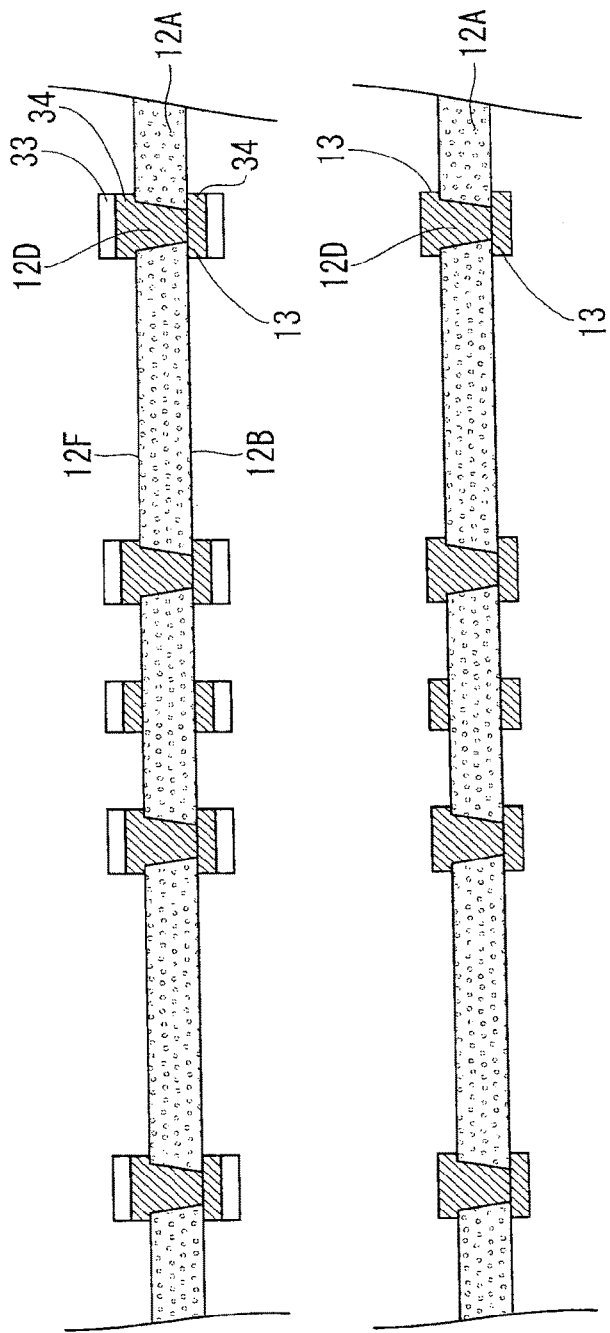
FIG. 3A-3C are cross-sectional side views illustrating processes for manufacturing the wiring board with a built-in electronic component.

(5) Etching is performed. As illustrated in FIG. 3A, of the electrolytic plating layer 34, a portion that is exposed from the etching resist 33 is removed.

Figure 3B:
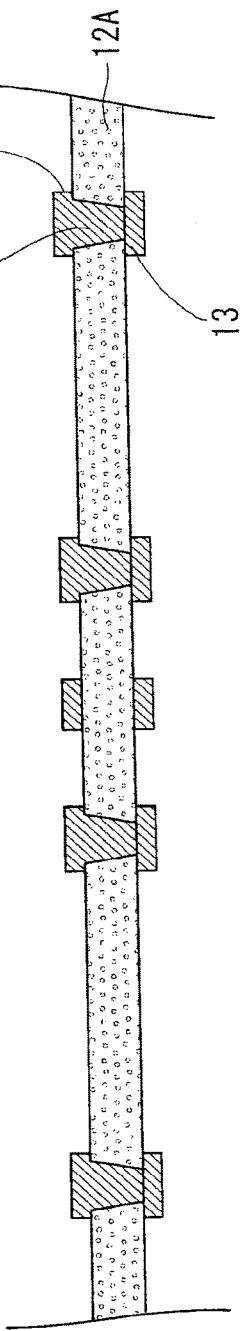

(6) The etching resist 33 is peeled. As illustrated in FIG. 3B, the first conductive layer 13 is formed by the remaining electrolytic plating layer 34. As a result, a state is achieved in which the first conductive layers (13, 13) on the front and back sides of the central insulating resin layer (12A) are connected by the via conductors (12D).

Figure 3C:
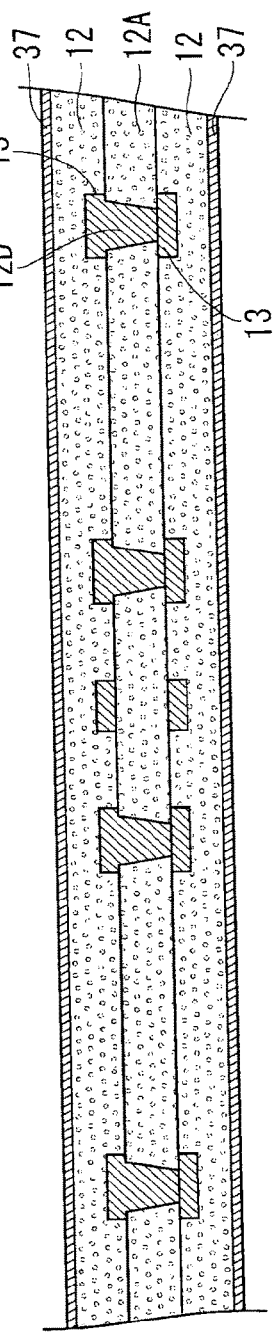

(7) As illustrated in FIG. 3C, a prepreg as a first insulating resin layer 12 and a copper foil 37 are laminated on each of the first conductive layers (13, 13) on the front and back sides of the central insulating resin layer (12A), and the resulting substrate is hot-pressed. In this case, spaces between portions of each of the first conductive layers (13, 13) are filled with the prepreg.

Figure 4A:
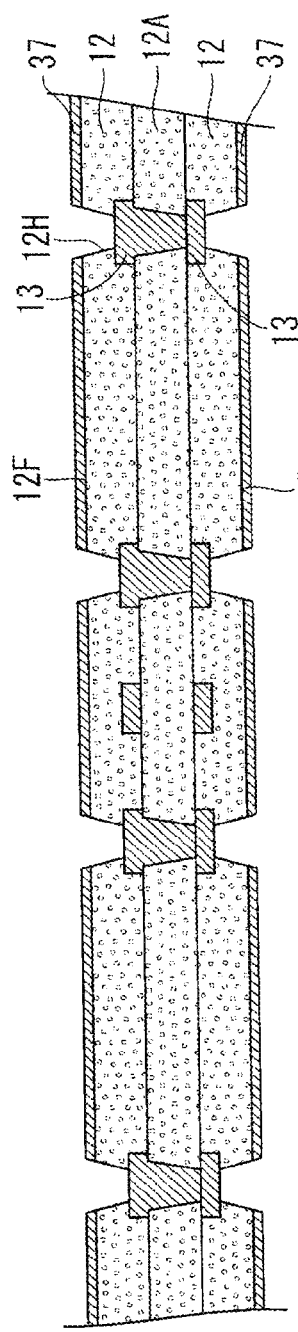
FIG. 4A-4C are cross-sectional side views illustrating processes for manufacturing the wiring board with a built-in electronic component.

(8) As illustrated in FIG. 4A, the multiple via holes (12H, 12H) are formed by irradiating CO2 laser to the first insulating resin layers 12 on the front and back sides. The via holes (12H, 12H) are formed on the first conductive layers (13, 13).

Figure 4B:
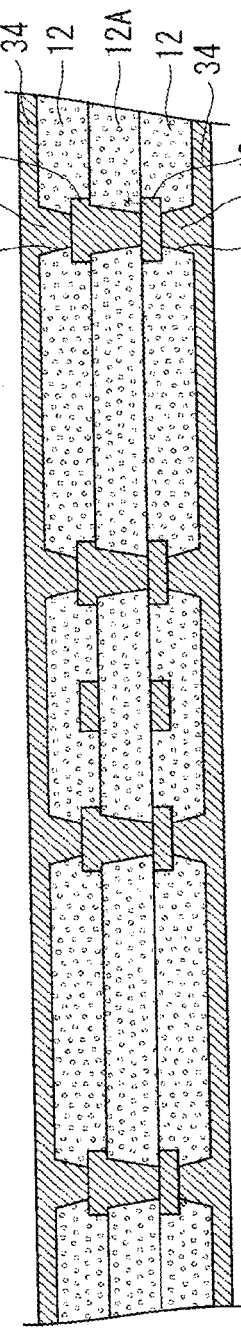

(9) An electrolytic plating treatment is performed. As illustrated in FIG. 4B, the via holes (12H, 12H) are filled with electrolytic plating, and the via conductors (12D, 12D) are formed, and electrolytic plating layers (34, 34) are formed.

Figure 4C:
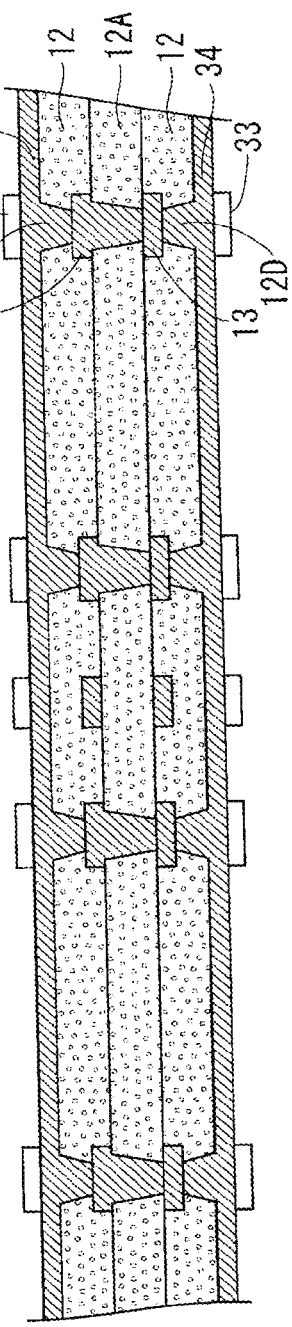

(10) As illustrated in FIG. 4C, etching resists (33, 33) of predetermined patterns are respectively formed on the electrolytic plating layers (34, 34).

(11) Etching is performed. As illustrated in FIG. 5A, of the electrolytic plating layers (34, 34), portions that are exposed from the etching resists (33, 33) are removed.

(12) The etching resists (33, 33) are peeled. As illustrated in FIG. 5B, the first conductive layers (13, 13) are formed by the remaining electrolytic plating layers (34, 34).

(13) As illustrated in FIG. 5C, the small cavity (16A) is formed using a router or CO2 laser in the group of the first insulating resin layers 12 that have been laminated (hereinafter, simply referred to as the "first insulating resin layer 12 group").

Figure 6A:
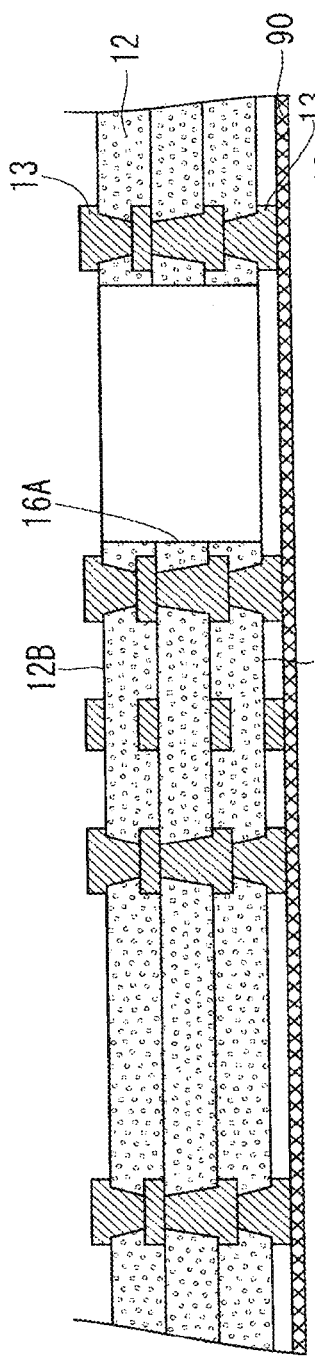
FIG. 6A-6C are cross-sectional side views illustrating processes for manufacturing the wiring board with a built-in electronic component.

(14) As illustrated in FIG. 6A, a tape 90 formed of a PET film is affixed to an F surface (12F) of the first insulating resin layer 12 group so as to close the small cavity (16A).

(15) The multilayer ceramic capacitor (17A) is prepared.

Figure 6B:
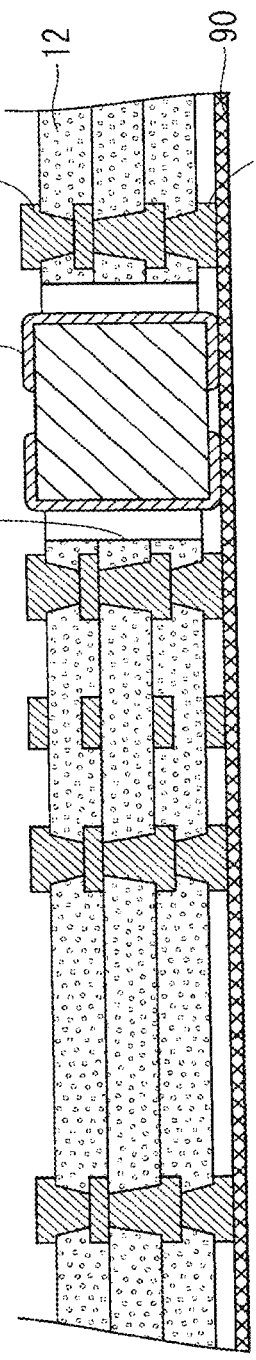

(16) As illustrated in FIG. 6B, the multilayer ceramic capacitor (17A) is accommodated in the small cavity (16A) using a mounter (not illustrated in the drawings).

Figure 6C:
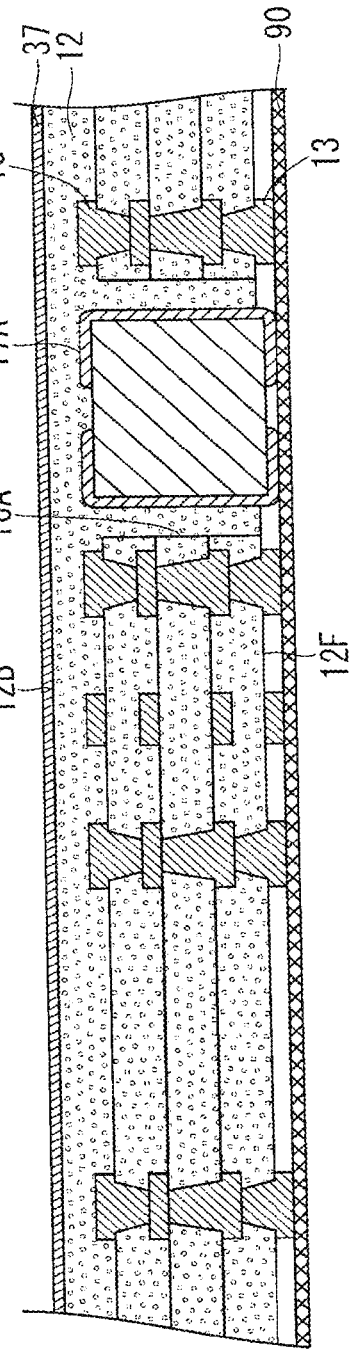

(17) As illustrated in FIG. 6C, a prepreg as a first insulating resin layer 12 and a copper foil 37 are laminated on a first conductive layer 13 on a B surface (12B), which is a back side surface of the first insulating resin layer 12 group, and then the resulting substrate is hot-pressed. In this case, spaces between portions of the first conductive layer 13 are filled with the prepreg, and a gap between the inner surface of the small cavity (16A) and the multilayer ceramic capacitor (17A) is filled with resin exuded from the superimposed first insulating resin layer 12.

(18) As illustrated in FIG. 7A, the tape 90 is removed.

(19) As illustrated in FIG. 7B, a prepreg as a first insulating resin layer 12 and a copper foil 37 are laminated on a first conductive layer 13 on the F surface (12F), which is a front side surface of the first insulating resin layer 12 group, and then the resulting substrate is hot-pressed. In this case, spaces between portions of the first conductive layer 13 are filled with the prepreg, and a gap between the inner surface of the small cavity (16A) and the multilayer ceramic capacitor (17A) is filled with resin exuded from the superimposed first insulating resin layer 12. Further, the element holding resin (16J) is formed by the thermosetting resin that exudes from the front and back side first insulating resin layers (12, 12) covering the small cavity (16A) and is filled in the gap between the inner surface of the small cavity (16A) and the multilayer ceramic capacitor (17A).

(20) By the same processing as described in the above (8)-(12), as illustrated in FIG. 7C, a state is achieved in which, the first conductive layers 13 are formed on outermost surfaces of the first insulating resin layer 12 group and, due to the via conductors (12D), the first conductive layers 13 are connected to each other and the first conductive layers 13 and the multilayer ceramic capacitor (17A) are connected to each other.

(21) As illustrated in FIG. 8A, the large cavity (16B) is formed in the first insulating resin layer 12 group using a router or CO2 laser.

(22) By the same processing as described in the above (14)-(19), as illustrated in FIG. 8B, the multilayer ceramic coil (17B) is accommodated in the large cavity (16B) and, from front and back sides of the resulting substrate, the first insulating resin layers 12 are laminated.

(23) By the same processing as described in the above (8)-(12), as illustrated in FIG. 9, a state is achieved in which, the first conductive layers 13 are formed on outermost surfaces of the first insulating resin layer 12 group and, due to the via conductors (12D), the first conductive layers 13 are connected to each other and the first conductive layers 13 and the multilayer ceramic coil (17B) are connected to each other. As a result, the multilayer core substrate 11 is completed. The above-described method for forming the conductive layers 13 of the multilayer core substrate 11 is referred to as a subtractive method or tenting.

Next, formation of the build-up layers 20 and subsequent manufacturing processes are described.

Figure 10:
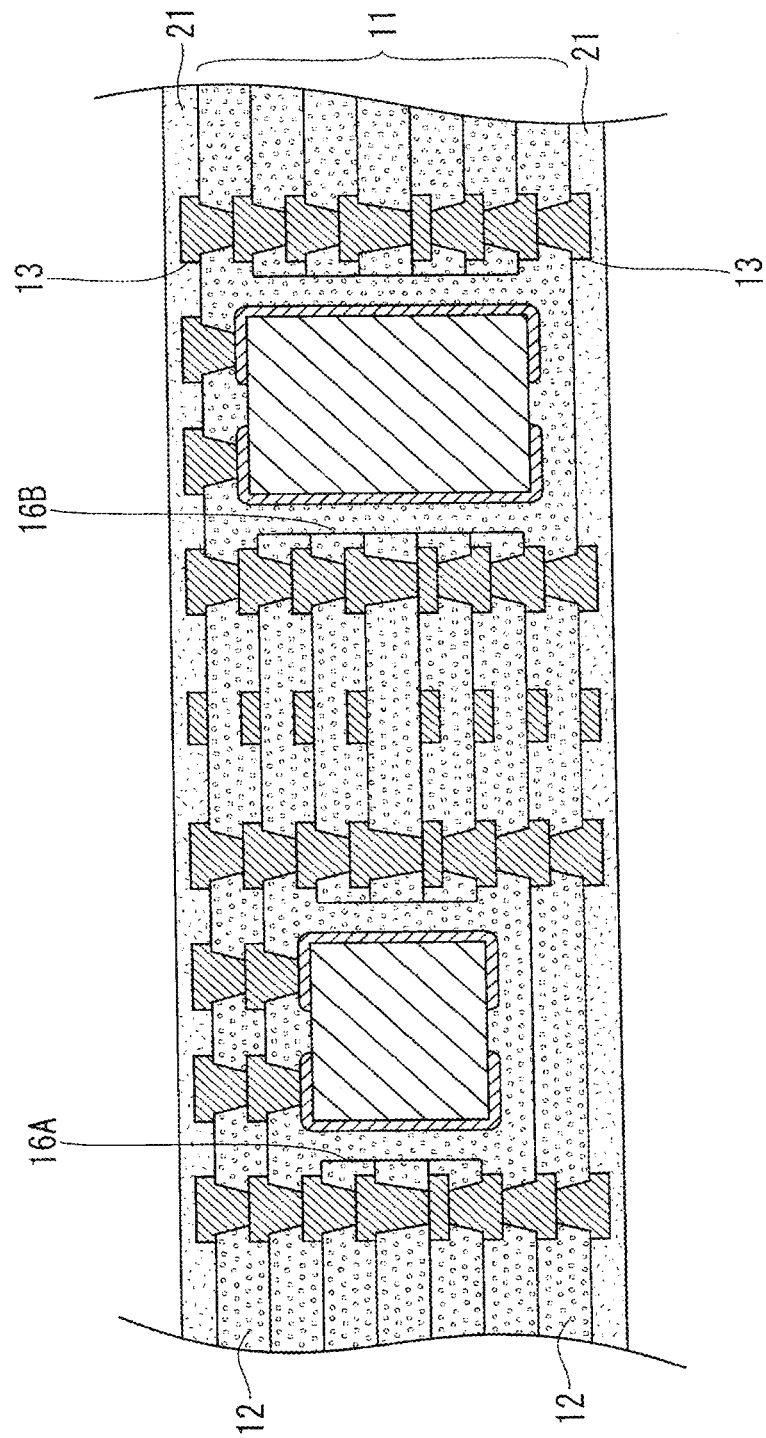
FIG. 10 is a cross-sectional side view illustrating a process for manufacturing the wiring board with a built-in electronic component.

(1) As illustrated in FIG. 10, an ABF film as a second insulating resin layer 21 is laminated on each of the outermost first conductive layers (13, 13) on the front and back sides of the multilayer core substrate 11, and the resulting substrate is hot-pressed.

Figure 11:
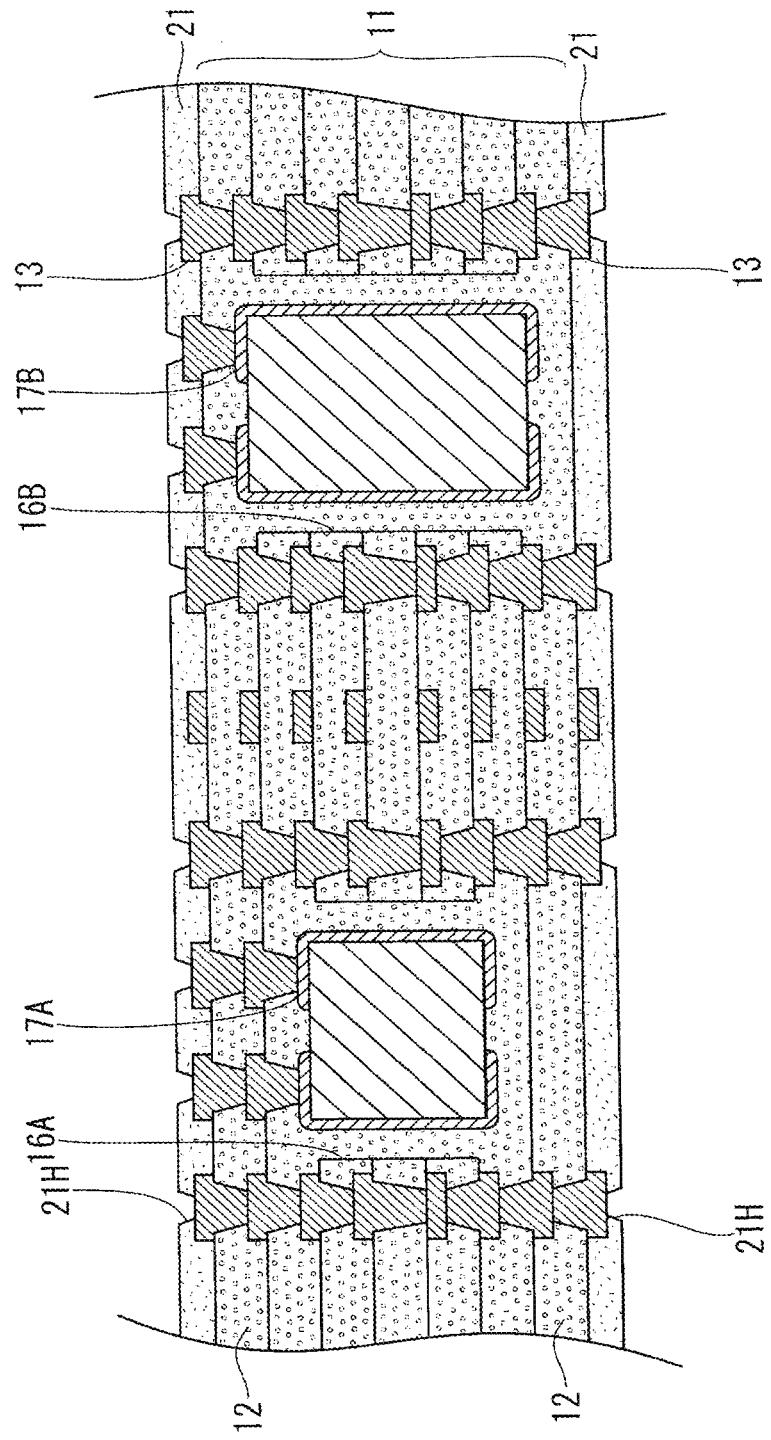
FIG. 11 is a cross-sectional side view illustrating a process for manufacturing the wiring board with a built-in electronic component.

(2) As illustrated in FIG. 11, the multiple via holes (12H) are formed by irradiating CO2 laser to the second insulating resin layers (21, 21) on the front and back sides of the multilayer core substrate 11.

(3) An electroless plating treatment is performed. Electroless plating films (not illustrated in the drawings) are formed on the second insulating resin layers (21, 21) and in the via holes (21H, 21H).

Figure 12:
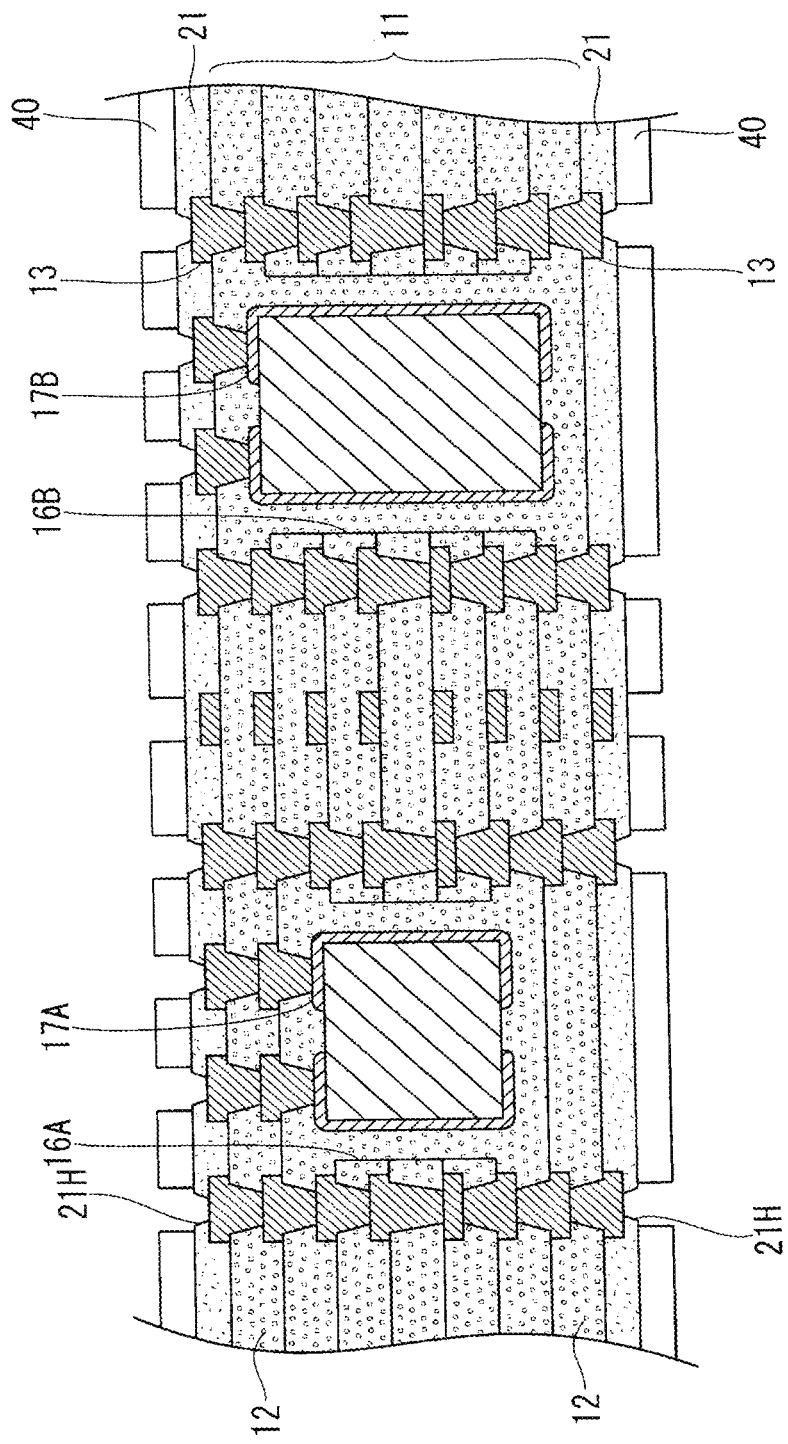
FIG. 12 is a cross-sectional side view illustrating a process for manufacturing the wiring board with a built-in electronic component.

(4) As illustrated in FIG. 12, plating resists 40 of predetermined patterns are respectively formed on the electroless plating films.

Figure 13:
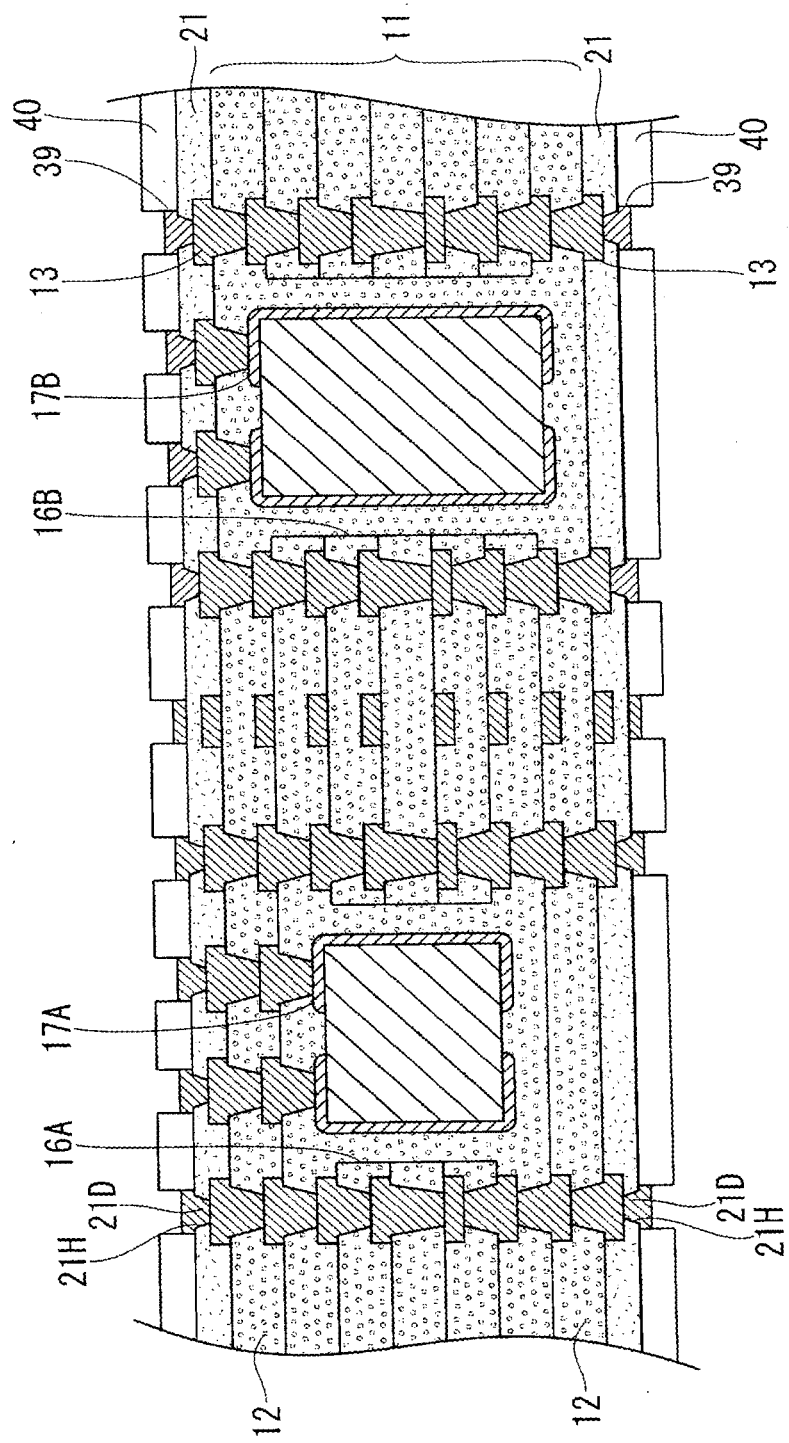
FIG. 13 is a cross-sectional side view illustrating a process for manufacturing the wiring board with a built-in electronic component.

(5) An electrolytic plating treatment is performed. As illustrated in FIG. 13, the via holes (21H, 21H) are filled with plating and the via conductors (21D, 21D) are formed. Further, electrolytic plating films 39, 39 are formed on portions of the electroless plating films (not illustrated in the drawings) on the second insulating resin layers (21, 21), the portions being exposed from the plating resists 40.

Figure 14:
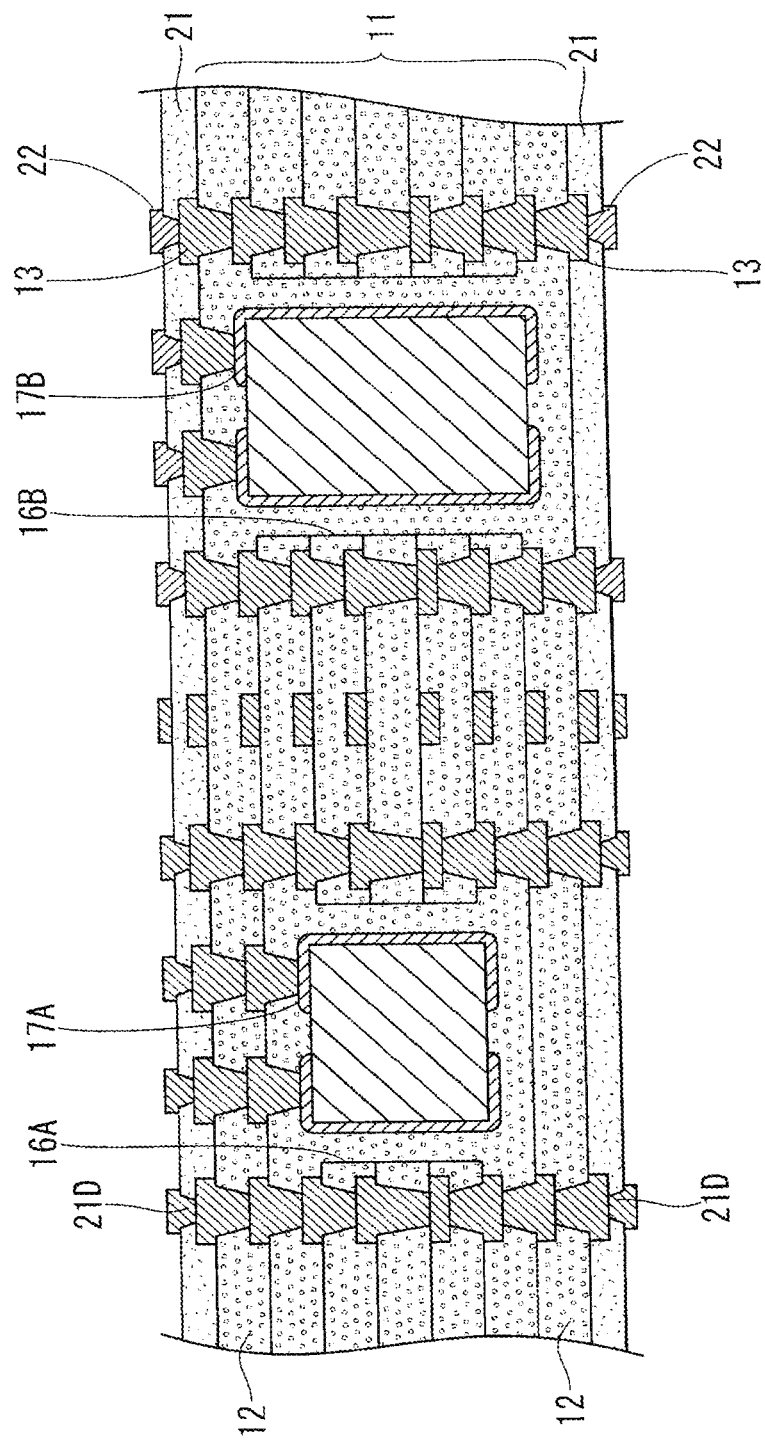
FIG. 14 is a cross-sectional side view illustrating a process for manufacturing the wiring board with a built-in electronic component.

(6) The plating resists 40 are removed, and the electroless plating films (not illustrated in the drawings) that are below the plating resists 4 are removed. As illustrated in FIG. 14, the second conductor layers 22 are respectively formed on the second insulating resin layers 21 on the front and back sides of the multilayer core substrate 11 by the remaining electrolytic plating films 39 and electroless plating films. Portions of the outermost first conductive layers 13 on the front and back sides of the multilayer core substrate 11 and the second conductive layers 22 are connected by the via conductors (21D).

Figure 15:
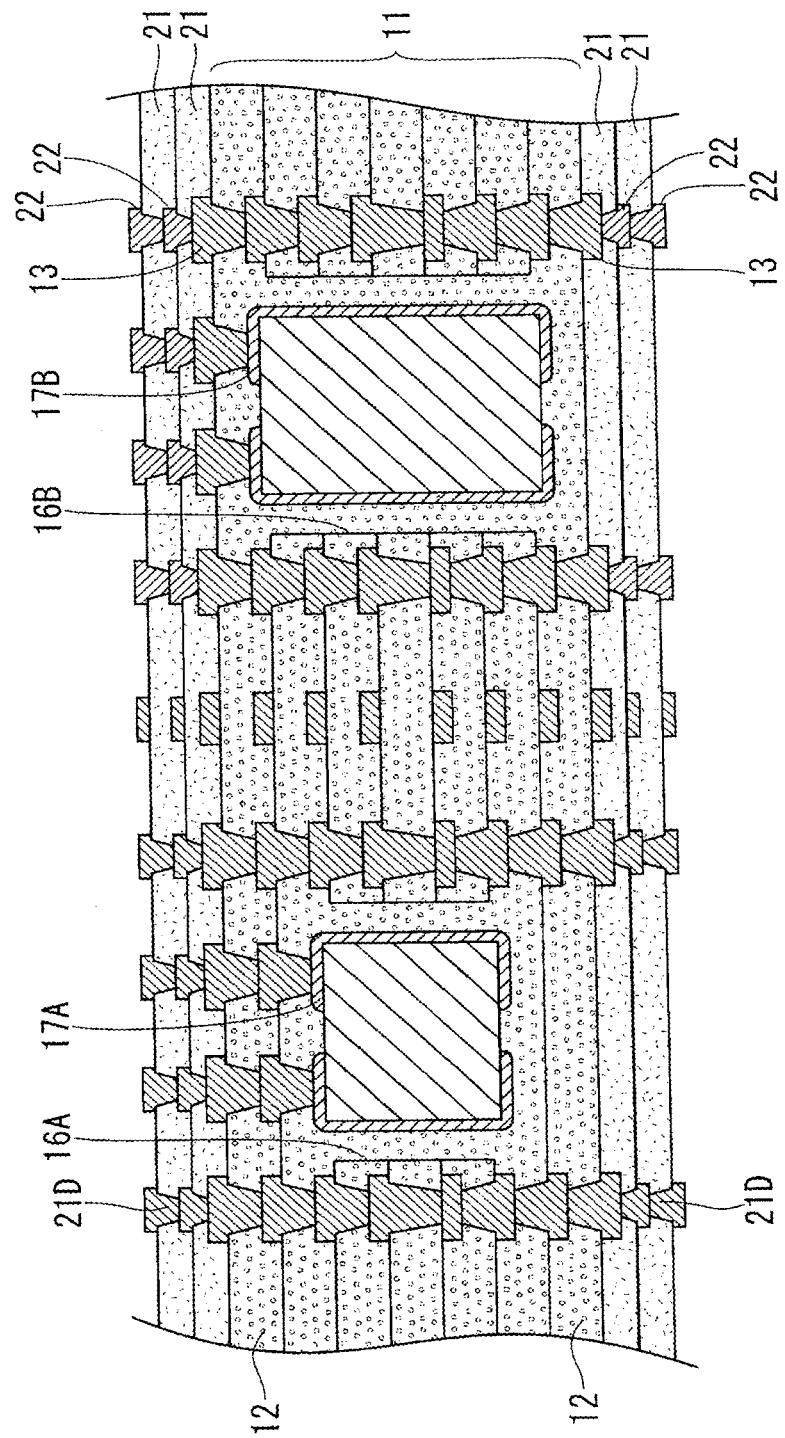
FIG. 15 is a cross-sectional side view illustrating a process for manufacturing the wiring board with a built-in electronic component.

(7) By the same processing as described in the above (1)-(6), as illustrated in FIG. 15, a state is achieved in which, on each of the second conductive layers 22 on the front and back sides of the multilayer core substrate 11, a second insulating resin layer 21 and a second conductive layer 22 are further formed, and the second conductive layers 22 are connected to each other by the via conductors (21D).

Figure 16:
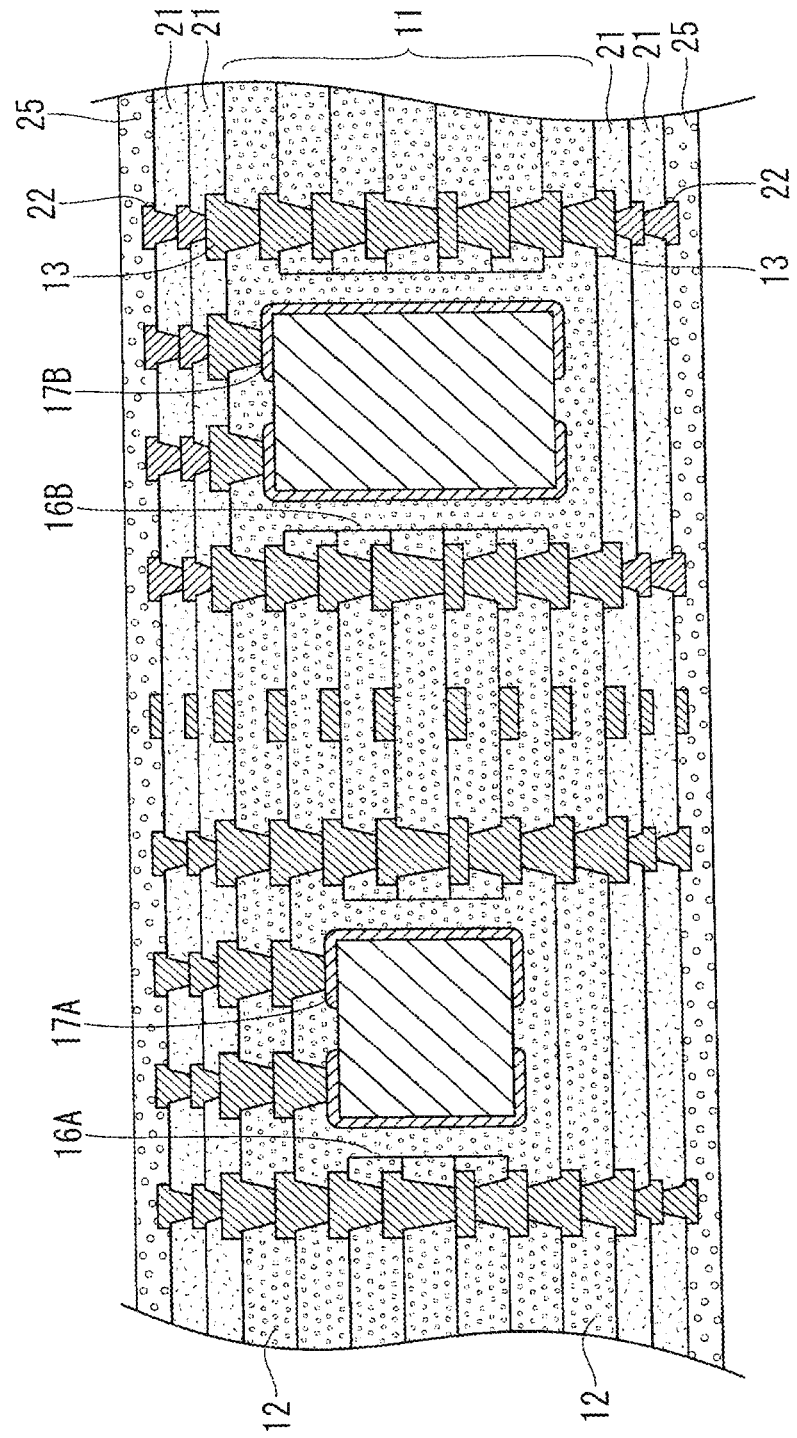
FIG. 16 is a cross-sectional side view illustrating a process for manufacturing the wiring board with a built-in electronic component.

(8) As illustrated in FIG. 16, the solder resist layers (25, 25) are respectively laminated on the outermost second conductive layers 22 on the front and back sides of the multilayer core substrate 11.

Figure 17:
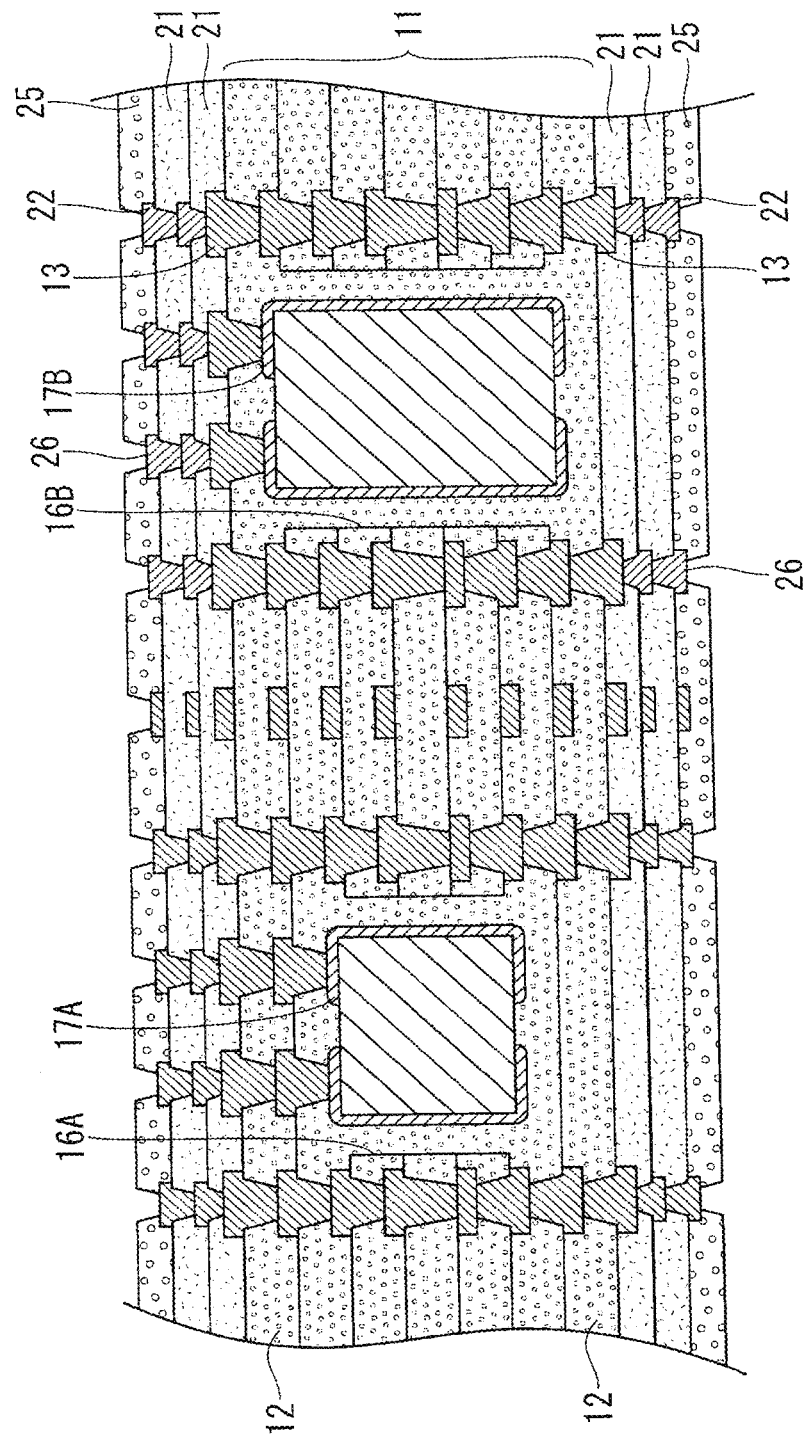
FIG. 17 is a cross-sectional side view illustrating a process for manufacturing the wiring board with a built-in electronic component.
Figure 18:
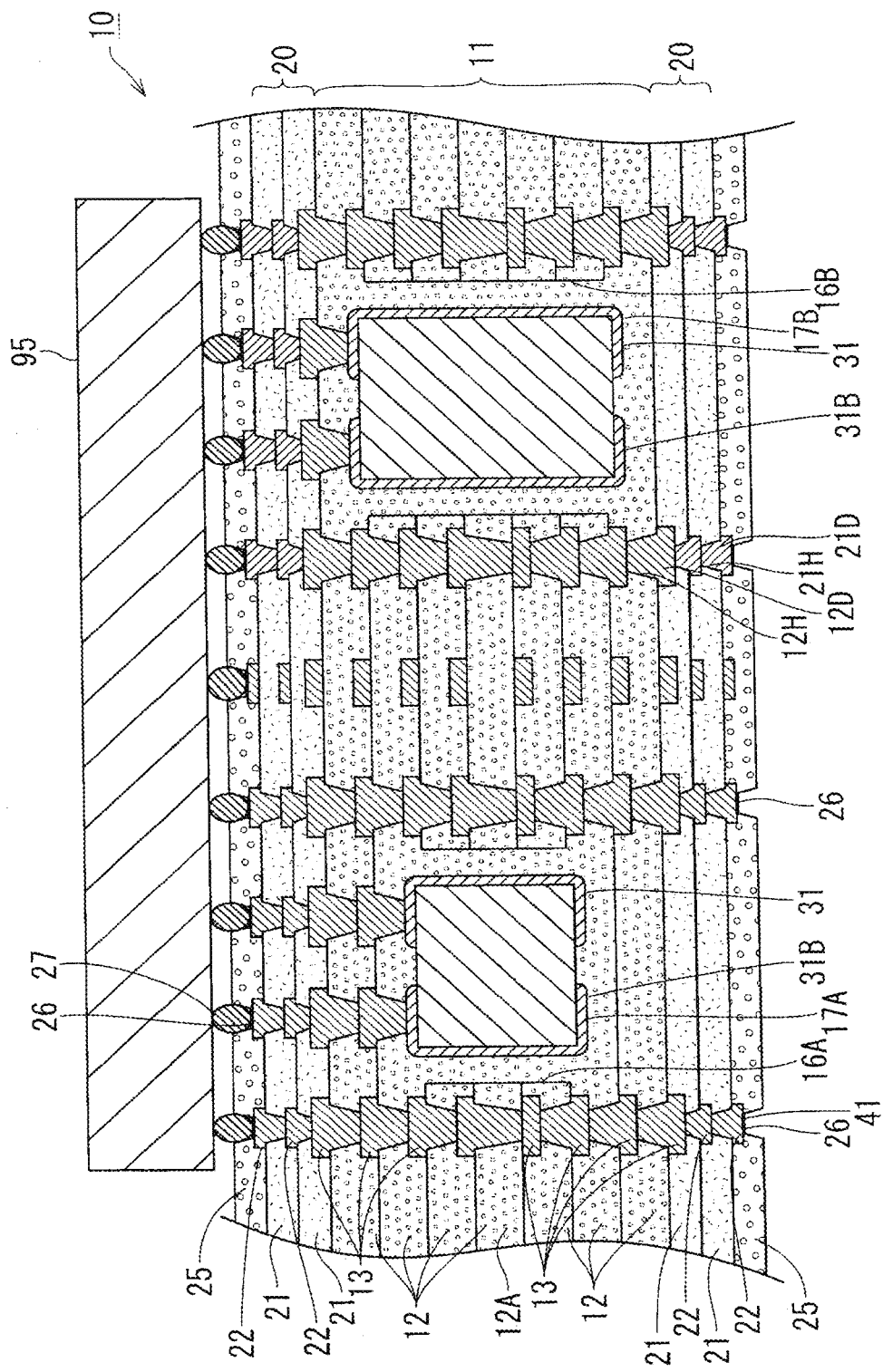
FIG. 18 is a cross-sectional side view of the wiring board with a built-in electronic component in a state in which a CPU is mounted.

(9) As illustrated in FIG. 17, tapered pad holes are formed at predetermined places on the solder resist layers (25, 25) on the front and back sides of the multilayer core substrate 11, and portions of the outermost second conductive layers 22 on the front and back sides of the multilayer core substrate 11 that are exposed from the pad holes become the pads 26.

(10) On each of the pads 26, a nickel layer, a palladium layer and a gold layer are laminated in this order and a metal film 41 illustrated in FIG. 1 is formed. As a result, the wiring board 10 with a built-in electronic component is completed. The above-described method for forming the second conductive layers 22 of the build-up layers 20 is referred to as a semi-additive method.

The description about the structure and the manufacturing method of the wiring board 10 with a built-in electronic component of the present embodiment is as given above. Next, an example of use and an operation effect of the wiring board 10 with a built-in electronic component are described. The wiring board 10 with a built-in electronic component of the present embodiment is used by forming solder bumps 27 on the pads 26 and mounting and soldering a CPU 95 or the like on the solder bumps 27. In this case, pads of the CPU 95 are connected via the via conductors (12D, 21D) to the electrodes (31, 31) of the multilayer ceramic capacitor (17A) and the multilayer ceramic coil (17B). The multilayer ceramic capacitor (17A) and the multilayer ceramic coil (17B), for example, can be connected to a power line for the CPU 95 and used to stabilize a voltage of the power line. Further, the multilayer ceramic capacitor (17A) and the multilayer ceramic coil (17B) can also be connected to a signal line and used for noise removal. Further, the multilayer ceramic capacitor (17A) and the multilayer ceramic coil (17B) overlap the entire CPU 95 when viewed from the plate thickness direction of the multilayer core substrate 11. A B surface (10B) side of the wiring board 10 with a built-in electronic component is connected to a motherboard (not illustrated in the drawings).

In the wiring board 10 with a built-in electronic component of the present embodiment, as described above, the multilayer ceramic capacitor (17A) is smaller than the multilayer ceramic coil (17B) in the plate thickness direction of the multilayer core substrate 11. Therefore, when the cavities (16A, 16B) that respectively accommodate the multilayer ceramic capacitor (17A) and the multilayer ceramic coil (17B) have the same size, the cavity (16A) is too large for the multilayer ceramic capacitor (17A).

However, in the wiring board 10 with a built-in electronic component of the present embodiment, the multilayer core substrate 11 is formed by laminating the multiple first insulating resin layers 12, and the cavities (16A, 16B) are respectively formed to penetrate predetermined numbers of first insulating resin layers 12 among the multiple first insulating resin layers 12. Therefore, the cavities (16A, 16B) can each be formed to match the thickness of the multilayer ceramic capacitor (17A) or the multilayer ceramic coil (17B), and a size balance between the multilayer ceramic capacitor (17A) and the cavity (16A) can be improved.

Further, when the cavity (16A) is too large for the multilayer ceramic capacitor (17A), it is possible that the first insulating resin layers 12 enter into the cavity (16A) so that unevenness of the multilayer core substrate 11 is increased. In addition, it is also possible that an amount of the element holding resin (16J) filled in the cavity (16A) is insufficient and fixation of the multilayer ceramic capacitor (17A) in the cavity (16A) is insufficient. In contrast, in the wiring board 10 with a built-in electronic component of the present embodiment, the cavities (16A, 16B) can each be formed to match the thickness of the multilayer ceramic capacitor (17A) or the multilayer ceramic coil (17B), and thus occurrence of the above-described problem can be prevented.

Further, the cavities (16A, 16B) are respectively formed by penetrating first insulating resin layer 12 groups of different numbers of first insulating resin layers 12 other than the central insulating resin layer (12A) at multiple timings in the manufacturing process of the multilayer core substrate 11. Therefore, the cavities (16A, 16B) having different sizes can be easily formed.

However, in general, among a substrate that is formed using a subtractive method, in which a resin film containing a core material is used for an insulating layer and a conductive layer is formed by etching, and a substrate that is formed using an semi-additive method, in which a resin film that does not contain a core material is used for an insulating layer and a conductive layer is formed by plating, rigidity of the substrate that is formed using a subtractive method is strong, whereas a dense (fine) wiring pattern can be formed in the substrate that is formed using a semi-additive method. In contrast, in the wiring board 10 with a built-in electronic component of the present embodiment, the multilayer core substrate 11 is formed using a subtractive method, and the build-up layers 20 are formed using a semi-additive method. Therefore, while dense (fine) wiring patterns can be formed in the outermost second conductive layers 22, overall rigidity of the wiring board 10 with a built-in electronic component can be improved.

Further, the first insulating resin layers 12 and the first conductive layers 13 of the multilayer core substrate 11 are relatively thick and the second insulating resin layers 21 and the second conductive layers 22 of the build-up layers 20 are relatively thin. Therefore, even when an effect is achieved that, while dense (fine) wiring patterns are formed in the outermost second conductive layers 22, the overall rigidity of the wiring board 10 with a built-in electronic component is improved, the wiring board 10 with a built-in electronic component can be formed thinner as compared to a case where the first insulating resin layers 12 and the first conductive layers 13 of the multilayer core substrate 11 and the second insulating resin layers 21 and the second conductive layers 22 of the build-up layers 20 are formed to have the same thicknesses.

Further, in the present embodiment, both of the two cavities (16A, 16B) are covered from front and back sides by the first insulating resin layers 12. Therefore, the element holding resin (16J) between the cavities (16A, 16B) and the multilayer ceramic capacitor (17A) or the multilayer ceramic coil (17B) is formed by the resin exuded from the first insulating resin layers 12 that each have a core material. As a result, as compared to a case where the cavities 16 are covered from front and back sides by the second insulating resin layers 21 and the element holding resin (16J) is formed by resin exuded from the second insulating resin layers 21 that do not each have a core material, movement of the multilayer ceramic capacitor (17A) or the multilayer ceramic coil (17B) in the cavities (16A, 16B) can be more restricted and fixation of the multilayer ceramic capacitor (17A) or the multilayer ceramic coil (17B) in the cavities (16A, 16B) can be more strengthened.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

Figure 19:
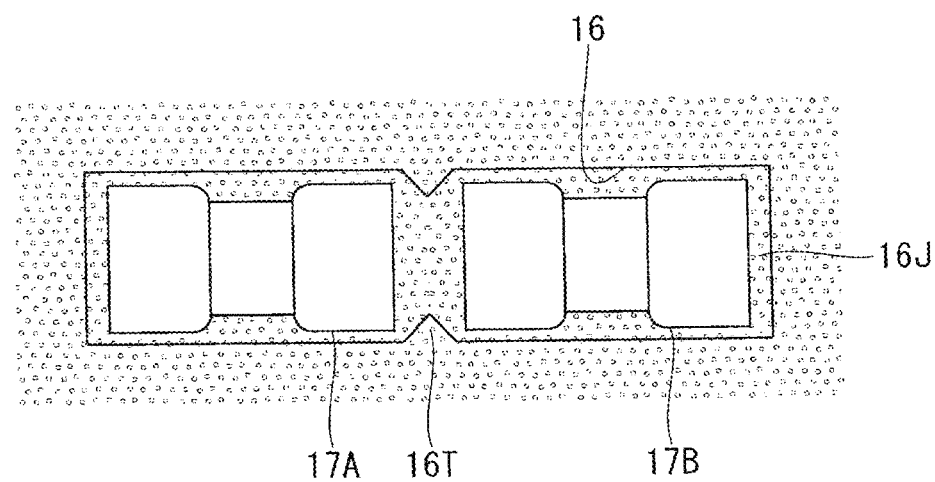
FIG. 19 is a partial cross-sectional plan view of a multilayer core substrate according to a modified embodiment.

(1) In the above embodiment, one electronic component is accommodated in each of the cavities 16. However, it is also possible that multiple electronic components are accommodated in one cavity 16. In this case, as illustrated in FIG. 19, projections (16T) may be formed in the cavity 16 to prevent contact between the electronic components.

(2) In the above embodiment, the first insulating resin layers 12 of the multilayer core substrate 11 are thicker than the second insulating resin layers 21 of the build-up layers 20. However, it is also possible that the second insulating resin layers 21 of the build-up layers 20 are thicker, or the first insulating resin layers 12 and the second insulating resin layers 21 have the same thickness.

(3) In the above embodiment, the first conductive layers 13 of the multilayer core substrate 11 are thicker than the second conductive layers 22 of the build-up layers 20. However, it is also possible that the second conductive layers 22 of the build-up layers 20 are thicker, or the first conductive layers 13 and the second conductive layers 22 have the same thickness.

Figure 20:
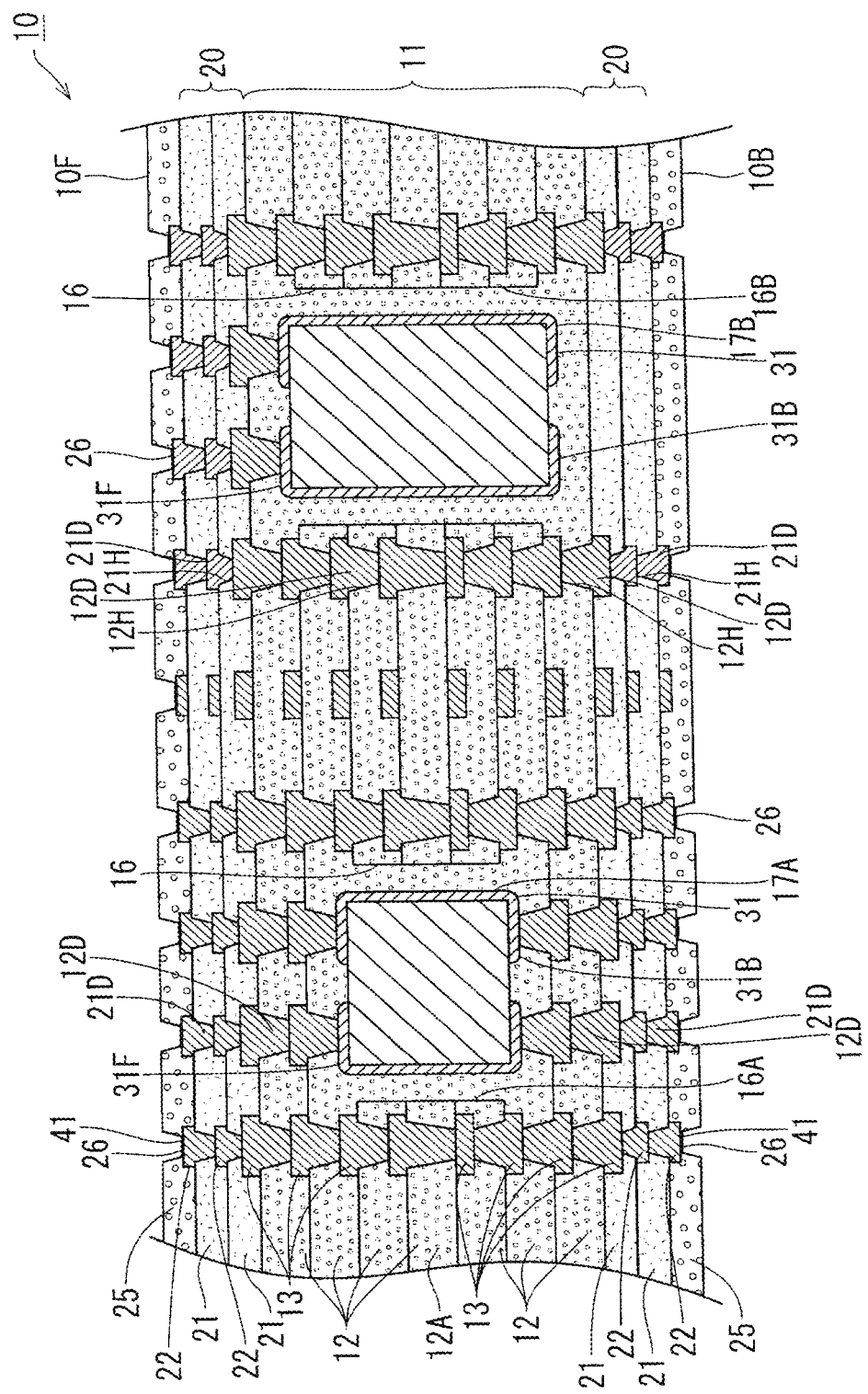
FIG. 20 is a cross-sectional side view of a wiring board with a built-in electronic component according to a modified embodiment.

(4) In the above embodiment, the via conductors (12D, 21D) that are connected to the multilayer ceramic capacitor (17A) are provided only on the F surface (10F) side. However, as illustrated in FIG. 20, it is also possible that the via conductors (12D, 21D) that are connected to the multilayer ceramic capacitor (17A) are provided on both the F surface (10F) side and the B surface (10B) side. In this case, it is also possible that the via conductors (12D, 21D) that are connected to the multilayer ceramic capacitor (17A) are connected to a motherboard.

(5) In the above embodiment, the number of the first insulating resin layers 12 that form the multilayer core substrate 11 is seven, which is an odd number. However, it is also possible that the number of the first insulating resin layers 12 is an even number. In this case, among the multiple first insulating resin layers 12, two middle first insulating resin layers 12 correspond to the central insulating resin layer (12A).

(6) In the above embodiment, an "electronic component" according to an embodiment of the present invention is the multilayer ceramic capacitor (17A) or the multilayer ceramic coil (17B). However, for example, an "electronic component" may also be a passive component such as a capacitor, a resistor, a thermistor and a coil, or an active component such as an IC circuit. Further, the multiple "electronic components" that are accommodated in each cavity 16 may be the same electronic components or different electronic components.

(7) In the above embodiment, both of two cavities (16A, 16B) are covered from front and back sides by the first insulating resin layers 12. However, for example, it is also possible to adopt a structure in which the large cavity (16B) is covered from front and back sides by the second insulating resin layers 21. In this case, the element holding resin (16J) in the large cavity (16B) is formed by resin exuded from the second insulating resin layers 21.

(8) In the above embodiment, the multilayer ceramic capacitor (17A) and the multilayer ceramic coil (17B) are respectively thicker than the cavities (16A, 16B) that accommodate the multilayer ceramic capacitor (17A) and the multilayer ceramic coil (17B). However, it is also possible that the multilayer ceramic capacitor (17A) and the multilayer ceramic coil (17B) are respectively thinner than the cavities (16A, 16B). Even in this case, the difference between the thickness of the multilayer ceramic capacitor (17A) (multilayer ceramic coil (17B)) and the length of cavity (16A) (cavity (16B)) can be reduced, the size balance between the multilayer ceramic capacitor (17A) and the multilayer ceramic coil (17B) and the cavities (16A, 16B) can be improved.

Figure 21:
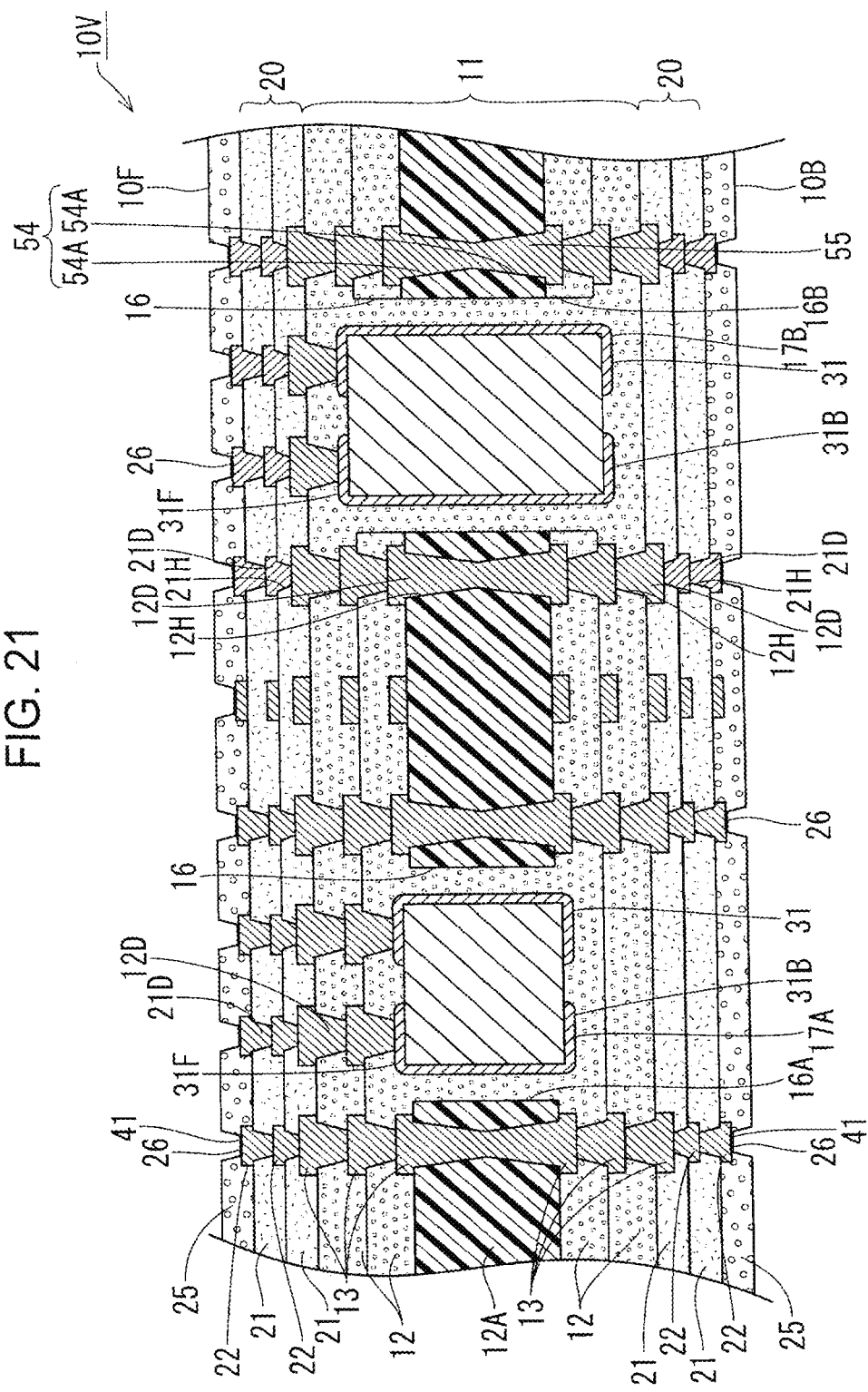
FIG. 21 is a cross-sectional side view of a wiring board with a built-in electronic component according to a modified embodiment.

(9) In the above embodiment, all of the first insulating resin layers 12 of the multilayer core substrate 11 have the same thickness. However, as illustrated in FIG. 21, it is also possible that, among the multiple first insulating resin layers 12, the central insulating resin layer (12A) is formed to be thicker than the other first insulating resin layers 12, in the wiring board (10V) with a built-in electronic component illustrated in FIG. 21, the thickness of the central insulating resin layer (12A) is three times the thickness of the other first insulating resin layers 12. In this case, the small cavity (16A) is formed to penetrate only the central insulating resin layer (12A), whereas the large cavity (16B) is formed to penetrate the central insulating resin layer (12A) and two first insulating resin layers (12, 12), one on each of the front and back sides of the central insulating resin layer (12A).

Further, in the central insulating resin layer (12A) of the wiring board (10V) with a built-in electronic component, electrical conduction through holes 54 are formed. The electrical conduction through holes 54 are each formed in a middle-constricted shape in which small diameter side ends of tapered holes (54A, 54A) are communicatively connected, the tapered holes (54A, 54A) being respective formed by drilling from the front and back surfaces of the central insulating resin layer (12A) and being gradually reduced in diameter toward a deep side. The electrical conduction through holes 54 are filled with plating, and through hole electrical conductors 55 are formed. Due to the through hole electrical conductors 55, the first conductive layers (13, 13) on the front and back sides of the central insulating resin layer (12A) are connected.

In a wiring board with a built-in electronic component, when sizes of electronic components accommodated in its cavities are different from each other, a cavity that penetrates its core substrate can be excessively large for a small electronic component. That is, in such a wiring board with a built-in electronic component, a size balance between a cavity and an electronic component can be poor.

A wiring board with a built-in electronic component according to an embodiment of the present invention has a good size balance between a cavity and an electronic component, and a method for manufacturing a wiring board with a built-in electronic component according to an embodiment of the present invention achieves a good size balance between a cavity and an electronic component.

According to one aspect of the present invention, a wiring board with a built-in electronic component includes: a multilayer core substrate that is formed by alternately laminating multiple insulating resin layers and multiple conductive layers; build-up layers that are respectively laminated on front and back sides of the multilayer core substrate, the build-up layers being each formed by laminating an insulating resin layer and a conductive layer that have compositions different from those of the multilayer core substrate; and multiple cavities that each penetrate at least one insulating resin layer of the multilayer core substrate, and each accommodate an electronic component. In multiple cavities include a first cavity and a second cavity that have mutually different lengths in a plate thickness direction of the multilayer core substrate. A central insulating resin layer in the plate thickness direction of the multilayer core substrate is common to the multiple cavities and is positioned at centers in the thickness direction of the cavities.

Obviously, numerous modifications and variations of the present invention are possible in light of the above teachings. It is therefore to be understood that within the scope of the appended claims, the invention may be practiced otherwise than as specifically described herein.

What is claimed is:
1. A wiring board with a built-in electronic component, comprising:
   a plurality of electronic components;
   a multilayer core substrate comprising a plurality of insulating resin layers and a plurality of conductive layers such that the plurality of insulating resin layers includes a central insulating resin layer formed in a center position of the multilayer core substrate in a thickness direction of the multilayer core substrate;
   a first build-up layer formed on a first surface of the multilayer core substrate and comprising an insulating resin layer and a conductive layer such that the insulating resin layer in the first build-up layer has a resin composition which is different from a resin composition of the insulating resin layers in the multilayer core substrate; and
   a second build-up layer formed on a second surface of the multilayer core substrate and comprising an insulating resin layer and a conductive layer such that the insulating resin layer in the second build-up layer has a resin composition which is different from the resin composition of the insulating resin layers in the multilayer core substrate,
   wherein the multilayer core substrate has a plurality of cavities accommodating the plurality of electronic components, respectively, and including a first cavity and a second cavity such that the first and second cavities have different lengths in the thickness direction of the multilayer core substrate and are penetrating through the central insulating resin layer at centers of the first and second cavities in the thickness direction of the multilayer core substrate.

2. A wiring board with a built-in electronic component according to claim 1, wherein the multilayer core substrate comprises element holding resin filling spaces formed between the multilayer core substrate and the electronic components in the cavities, and the element holding resin has a resin composition which is same as a resin composition of the insulating resin layers in the multilayer core substrate.

3. A wiring board with a built-in electronic component according to claim 1, wherein each of the insulating resin layers in the multilayer core substrate has a thickness which is greater than a thickness of each of the insulating resin layers in the first and second build-up layers.

4. A wiring board with a built-in electronic component according to claim 1, wherein each of the conductive layers in the multilayer core substrate has a thickness which is greater than a thickness of each of the conductive layers in the first and second build-up layers.

5. A wiring board with a built-in electronic component according to claim 1, wherein the multilayer core substrate comprises a plurality of via conductors formed through the insulating resin layers in the multilayer core substrate, respectively, the first build-up layer comprises a plurality of via conductors formed through the insulating resin layer in the first build-up layer, the second build-up layer comprises a plurality of via conductors formed through the insulating resin layer in the second build-up layer, and each of the via conductors in the multilayer core substrate has a via diameter which is greater than a via diameter of each of the via conductors in the first and second build-up layers.

6. A wiring board with a built-in electronic component according to claim 1, wherein the multilayer core substrate is formed such that the second cavity has a length in the thickness direction of the multilayer core substrate, which is greater than a length of the first cavity by a total thickness of an even number of the insulating resin layers in the multilayer core substrate.

7. A wiring board with a built-in electronic component according to claim 1, wherein the electronic component accommodated in the first cavity is a capacitor component, and the electronic component accommodated in the second cavity is a coil component.

8. A wiring board with a built-in electronic component according to claim 1, wherein the first build-up layer comprises a connecting structure configured to mount a mounting electronic component to the first build-up layer such that when the mounting electronic component is connected to the connecting structure and mounted to the first build-up layer, the electronic components in the cavities are positioned directly underneath the mounting electronic component.

9. A wiring board with a built-in electronic component according to claim 1, wherein the conductive layers in the multilayer core substrate are formed by a subtractive process, and the conductive layers in the first and second build-up layers are formed by a semi-additive process.

10. A wiring board with a built-in electronic component according to claim 1, wherein each of the insulating resin layers in the multilayer core substrate includes a core material, and each of the insulating resin layers in the first and second build-up layers does not include a core material.

11. A method for manufacturing a wiring board with a built-in electronic component, comprising:

forming a multilayer core substrate comprising a plurality of insulating resin layers and a plurality of conductive layers such that the multilayer core substrate includes a central insulating resin layer positioned in a center position of the multilayer core substrate in a thickness direction of the multilayer core substrate and has a plurality of cavities which accommodates a plurality of electronic components, respectively;

positioning the plurality of electronic components in the plurality of cavities formed in the multilayer core substrate such that the plurality of electronic components is accommodated in the plurality of cavities, respectively;

forming on a first surface of the multilayer core substrate a first build-up layer comprising an insulating resin layer and a conductive layer such that the insulating resin layer in the first build-up layer has a resin composition which is different from a resin composition of the insulating resin layers in the multilayer core substrate; and forming on a second surface of the multilayer core substrate a second build-up layer comprising an insulating resin layer and a conductive layer such that the insulating resin layer in the second build-up layer has a resin composition which is different from the resin composition of the insulating resin layers in the multilayer core substrate, wherein the forming of the multilayer core substrate comprises forming the plurality of cavities such that the plurality of cavities includes a first cavity and a second cavity which have different lengths in the thickness direction of the multilayer core substrate and which are penetrating through the central insulating resin layer at centers of the first and second cavities in the thickness direction of the multilayer core substrate.

12. A method for manufacturing a wiring board according to claim 11, wherein the positioning of the electronic components comprises filling a space formed between the multilayer core substrate and a first electronic component of the electronic components placed in the first cavity with element holding resin derive from two insulating resin layers covering two opening ends of the first cavity in the multilayer core substrate, and filling a space formed between the multilayer core substrate and a second electronic component of the electronic components placed in the second cavity with element holding resin derive from two insulating resin layers covering two opening ends of the second cavity in the multilayer core substrate.

13. A method for manufacturing a wiring board according to claim 11, wherein the multilayer core substrate and the first and second build-up layers are formed such that each of the insulating resin layers in the multilayer core substrate has a thickness which is greater than a thickness of each of the insulating resin layers in the first and second build-up layers.

14. A method for manufacturing a wiring board according to claim 11, wherein the multilayer core substrate and the first and second build-up layers are formed such that each of the conductive layers in the multilayer core substrate has a thickness which is greater than a thickness of each of the conductive layers in the first and second build-up layers.

15. A method for manufacturing a wiring board according to claim 11, wherein the forming of the multilayer core substrate comprises forming a plurality of via conductors through the insulating resin layers in the multilayer core substrate, respectively, the forming of the first build-up layer comprises forming a plurality of via conductors through the insulating resin layer in the first build-up layer such that each of the via conductors in the multilayer core substrate has a via diameter which is greater than a via diameter of each of the via conductors in the first build-up layer, and the forming of the second build-up layer comprises forming a plurality of via conductors through the insulating resin layer in the second build-up layer such that each of the via conductors in the multilayer core substrate has a via diameter which is greater than a via diameter of each of the via conductors in the second build-up layer.

16. A method for manufacturing a wiring board according to claim 11, wherein the forming of the multilayer core substrate comprises forming the plurality of cavities such that the second cavity has a length in the thickness direction of the multilayer core substrate, which is greater than a length of the first cavity by a total thickness of an even number of the insulating resin layers in the multilayer core substrate.

17. A method for manufacturing a wiring board according to claim 11, wherein the electronic component accommodated in the first cavity is a capacitor component, and the electronic component accommodated in the second cavity is a coil component.

18. A method for manufacturing a wiring board according to claim 11, wherein the forming of the first build-up layer comprises forming a connecting structure configured to mount a mounting electronic component to the first build-up layer such that when the mounting electronic component is connected to the connecting structure and mounted to the first build-up layer, the electronic components in the cavities are positioned directly underneath the mounting electronic component.

19. A method for manufacturing a wiring board according to claim 11, wherein the forming of the multilayer core substrate comprises forming the conductive layers in the multilayer core substrate by a subtractive process, the forming of the first build-up layer comprises forming the conductive layer in the first build-up layer by a semi-additive process, and the forming of the second build-up layer comprises forming the conductive layer in the second build-up layer by a semi-additive process.

20. A method for manufacturing a wiring board according to claim 11, wherein each of the insulating resin layers in the multilayer core substrate includes a core material, and each of the insulating resin layers in the first and second build-up layers does not includes a core material.

* * * * *